(12) United States Patent
Tsuji

(10) Patent No.: US 12,463,636 B2
(45) Date of Patent: Nov. 4, 2025

(54) POWER-ON RESET CIRCUIT

(71) Applicant: ROHM CO., LTD., Kyoto (JP)

(72) Inventor: Masanobu Tsuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 7 days.

(21) Appl. No.: 18/396,131

(22) Filed: Dec. 26, 2023

(65) Prior Publication Data

US 2024/0128969 A1    Apr. 18, 2024

Related U.S. Application Data

(63) Continuation of application No. PCT/JP2022/024377, filed on Jun. 17, 2022.

(30) Foreign Application Priority Data

Jun. 28, 2021  (JP) .................................. 2021-107097

(51) Int. Cl.
- *H03K 17/22* (2006.01)
- *H03K 3/037* (2006.01)
- *H03K 19/20* (2006.01)

(52) U.S. Cl.
CPC ......... *H03K 17/223* (2013.01); *H03K 3/0377* (2013.01); *H03K 19/20* (2013.01)

(58) Field of Classification Search
CPC ...... H03K 3/027; H03K 3/037; H03K 3/0377; H03K 17/22; H03K 17/223; H03K 17/24; H03K 19/20; G06F 1/20

See application file for complete search history.

(56) References Cited

U.S. PATENT DOCUMENTS

| | | | | |
|---|---|---|---|---|
| 10,187,052 B2 * | 1/2019 | Draxelmayr | ......... | H03K 3/0375 |
| 2007/0103201 A1 * | 5/2007 | Lau | .................... | H03K 19/0016 |
| | | | | 326/93 |

FOREIGN PATENT DOCUMENTS

| | | | |
|---|---|---|---|
| JP | S5781644 | A | 5/1982 |
| JP | S60189029 | A | 9/1985 |
| JP | H05160684 | A | 6/1993 |
| JP | H07239348 | A | 9/1995 |
| JP | 2006005459 | A | 1/2006 |

(Continued)

OTHER PUBLICATIONS

International Preliminary Report on Patentability for International Application No. PCT/JP2022/024377, issued Dec. 14, 2023 and PCT International Search Report and Written Opinion from corresponding International Application No. PCT/JP2022/024377; dated Jul. 19, 2022; 21 pages.

*Primary Examiner* — Long Nguyen

(74) *Attorney, Agent, or Firm* — CANTOR COLBURN LLP

(57) ABSTRACT

A power-on reset circuit supplies a reset pulse to a sequential circuit to be initialized. A latch circuit includes a first inversion circuit and a second inversion circuit structured to invert and amplify a signal input thereto, with an output node of the first inversion circuit connected to an input node of the second inversion circuit, and with an output node of the second inversion circuit connected to an input node of the first inversion circuit. A decision circuit receives the first signal from the output node of the first inversion circuit and the second signal from the output node of the second inversion circuit and generates a reset pulse on the basis of the first signal and the second signal.

20 Claims, 23 Drawing Sheets

(56) References Cited

FOREIGN PATENT DOCUMENTS

| JP | 2007282095 A | 10/2007 |
|----|--------------|---------|
| JP | 2014207615 A | 10/2014 |

* cited by examiner

POWER-ON RESET CIRCUIT

CROSS REFERENCE TO RELATED APPLICATIONS

This application is a continuation under 35 U.S.C. § 120 of PCT/JP2022/024377, filed Jun. 17, 2022, which is incorporated herein by reference, and which claimed priority to Japanese Application No. 2021-107097, filed Jun. 28, 2021. The present application likewise claims priority under 35 U.S.C. § 119 to Japanese Application No. 2021-107097, filed Jun. 28, 2021, the entire content of which is also incorporated herein by reference.

BACKGROUND

1. Technical Field

The present disclosure relates to a power-on reset circuit.

2. Description of the Related Art

In a semiconductor apparatus that incorporates a digital circuit, a state of an internal node of the digital circuit, or, a state of a sequential circuit, is undefined immediately after powered on, with the power supply voltage kept still low. The digital circuit therefore needs to be exactly initialized to a predetermined state (power-on resetting), after the semiconductor apparatus is activated, for which a power-on reset circuit structured to generate a reset pulse for the triggering is provided.

The power-on reset circuit usually monitors a power supply voltage supplied to the semiconductor apparatus and compares the power supply voltage with a threshold voltage. The power-on reset circuit is, therefore, generally structured with use of a voltage comparator that compares a power supply voltage or a detection signal derived therefrom, with a threshold voltage, or with use of a complementary metal oxide semiconductor (CMOS) inverter.

A prior power-on reset circuit has triggered power-on resetting, upon excess of the power supply voltage over a certain threshold value, on the assumption that the digital circuit is undefined when the power supply voltage is lower than a certain threshold (referred to as voltage scheme). An alternative prior power-on reset circuit has triggered power-on resetting upon elapse of a certain delay time after powered on, on the assumption that the digital circuit is undefined after powered on and before elapse of a certain length of time (referred to as delay scheme).

The voltage scheme and delay scheme will, however, result in improper power-on resetting, or will not be triggered at all, if the assumption fails. It has, therefore, been necessary to save a margin to the threshold or to the delay time. This has occasionally failed in triggering power-on resetting, upon transition of the digital circuit from the undefined state to the stable state. In a case with use of the voltage comparator, the power-on resetting cannot be triggered unless the power supply voltage exceeds the minimum operating voltage of the voltage comparator.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of Embodiments

Figure 1:
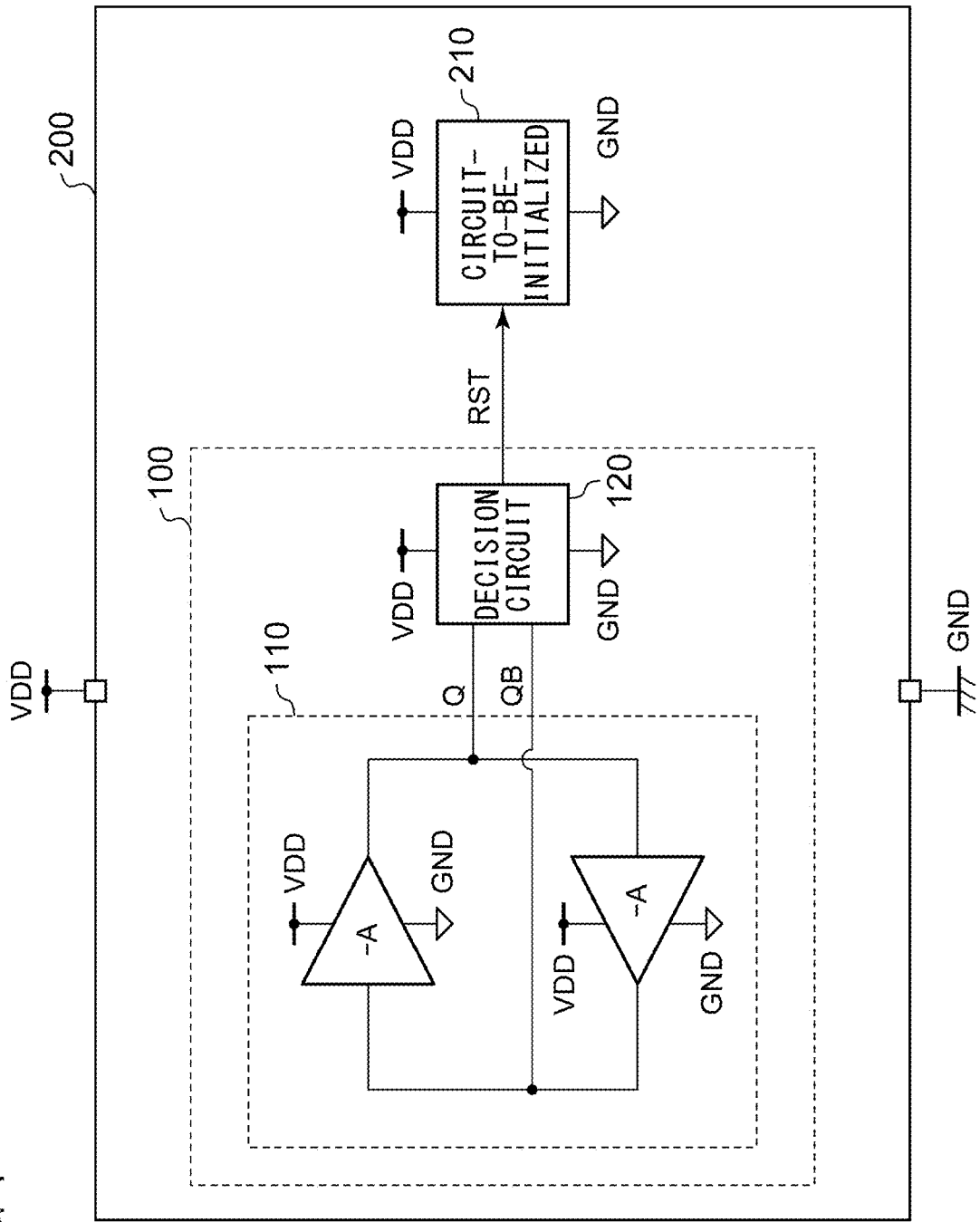
FIG. 1 is a circuit diagram of a semiconductor apparatus having a power-on reset circuit of an embodiment.

Some exemplary embodiments of the present disclosure will be outlined. This outline will provide introduction into the detailed description that follows and will brief some concepts of one or more embodiments for basic understanding thereof, without limiting the scope of the invention or disclosure. This summary is not an extensive overview of all possible embodiments and is therefore not intended to identify key elements or key elements of all embodiments, or to delineate the scope of some or all aspects. For convenience, the term "one embodiment" may be used to designate one embodiment (example or modified example), or a plurality of embodiments (Examples or Modified Examples) disclosed in the present specification.

A power-on reset circuit in one embodiment supplies a reset pulse to a sequential circuit to be initialized. The power-on reset circuit has: a latch circuit including a first inversion circuit and a second inversion circuit that invert and amplify a signal input thereto, with an output node of the first inversion circuit connected to an input node of the second inversion circuit, and with an output node of the second inversion circuit connected to an input node of the first inversion circuit; and a decision circuit structured to receive a first signal from the output node of the first inversion circuit and a second signal from the output node of the second inversion circuit, and to generate the reset pulse on the basis of the first signal and the second signal.

This structure, having provided thereto a latch circuit that simulates a sequential circuit to be initialized, can keep a reset pulse asserted when the latch circuit is undefined, and can negate the reset pulse when the latch circuit becomes stable, to cancel resetting of the sequential circuit. This makes it possible to quickly and exactly stabilize the sequential circuit. Since there is no need to save a large margin as in the voltage scheme or the delay scheme, so that the resetting can be triggered and cancelled earlier than before.

In one embodiment, the latch circuit may include a replica of a latch portion that constitutes an output stage of the sequential circuit. This enables exact detection of the stabilized state of the sequential circuit.

In one embodiment, the latch circuit has a gain equal to or smaller than a gain of a latch portion that constitutes an output stage of the sequential circuit. This can prevent the latch circuit from transitioning to the stable state earlier than the latch portion of the sequential circuit and can exactly negate the reset pulse upon or after stabilization of the latch portion, to cancel the resetting.

In one embodiment, each transistor included in the first inversion circuit and the second inversion circuit may have a shape ratio W/L smaller than a shape ratio W/L of each transistor that constitutes the latch portion that constitutes the output stage of the sequential circuit. This successfully lowers the gain of the latch circuit.

In one embodiment, at least either the first inversion circuit or the second inversion circuit may be a complementary metal oxide semiconductor (CMOS) inverter.

In one embodiment, at least either the first inversion circuit or the second inversion circuit may be a tri-state buffer. In one embodiment, at least either the first inversion circuit or the second inversion circuit may be a NOR gate. In one embodiment, at least either the first inversion circuit or the second inversion circuit may be a NAND gate.

In one embodiment, the number of levels of vertically-stacked transistors between a power supply line and a ground line, in each of the first inversion circuit and the second inversion circuit, may be equal to or larger than the number of levels of vertically-stacked transistors in a latch portion. Increase of the number of levels of vertically-stacked transistors in the latch circuit can lower the gain of the latch circuit.

In one embodiment, the number of levels of vertical stack on a higher potential side of the output node may be different from the number of levels of vertical stack on a lower potential side of the output node, in each of the first inversion circuit and the second inversion circuit. This can shift an intermediate potential, at which the first signal and the second signal are balanced in the undefined state, from a midpoint voltage $V_{DD}/2$, thereby simplifying determination by a decision circuit in the subsequent stage.

In one embodiment, the decision circuit may assert the reset pulse when the first signal and the second signal are undefined and may negate the reset pulse when the first signal and the second signal do not match. In this case, the reset pulse may be generated only by a combination circuit, without needing analog process.

In one embodiment, the decision circuit may include an exclusive OR gate or an exclusive NOR gate.

In one embodiment, the decision circuit may include the exclusive OR gate, wherein the exclusive OR gate has: a first input node; a second input node; an output node; a first inverter; a second inverter; a first P-channel transistor and a second P-channel transistor sequentially connected in series between a power supply line and the output node; a first N-channel transistor and a second N-channel transistor sequentially connected in series between the output node and a ground line; a third P-channel transistor and a fourth P-channel transistor sequentially connected in series between the power supply line and the output node; and a third N-channel transistor and a fourth N-channel transistor sequentially connected in series between the output node and the ground line. An input of the first inverter may be connected to the first input node, an output of the first inverter may be connected to a gate of the fourth P-channel transistor and a gate of the third N-channel transistor, an input of the second inverter may be connected to the second input node, an output of the second inverter may be connected to a gate of the first P-channel transistor and a gate of the fourth N-channel transistor, a gate of the second P-channel transistor and a gate of the first N-channel transistor may be connected to the first input node, and a gate of the third P-channel transistor and a gate of the second N-channel transistor may be connected to the second input node. This structure can improve symmetry of the two inputs of the exclusive OR gate, thereby preventing erroneous decision.

In one embodiment, the decision circuit may include the exclusive NOR gate, wherein the exclusive NOR gate has: a first input node; a second input node; an output node; a first inverter; a second inverter; a first P-channel transistor and a second P-channel transistor sequentially connected in series between a power supply line and the output node; a first N-channel transistor and a second N-channel transistor sequentially connected in series between the output node and a ground line; a third P-channel transistor and a fourth P-channel transistor sequentially connected in series between the power supply line and the output node; and a third N-channel transistor and a fourth N-channel transistor sequentially connected in series between the output node and the ground line. An input of the first inverter may be connected to the first input node, an output of the first inverter may be connected to a gate of the fourth P-channel transistor and a gate of the third N-channel transistor, an input of the second inverter may be connected to the second input node, an output of the second inverter may be connected to a gate of the third P-channel transistor and a gate of the second N-channel transistor, a gate of the second P-channel transistor and a gate of the first N-channel transistor may be connected to the first input node, and a gate of the first P-channel transistor and a gate of the fourth N-channel transistor may be connected to the second input node. This structure can improve symmetry of the two inputs of the exclusive NOR gate, thereby preventing erroneous decision.

In one embodiment, the decision circuit may assert the reset pulse, when a voltage of the first signal and a voltage of the second signal fall within a decision voltage range defined so as to include thresholds of the first inversion circuit and the second inversion circuit.

In one embodiment, the decision circuit may include: a first hysteresis comparator structured to compare the first signal with an upper limit voltage and a lower limit voltage of the decision voltage range; a second hysteresis comparator structured to compare the second signal with the upper limit voltage and the lower limit voltage of the voltage range; and a logic gate structured to receive an output of the first hysteresis comparator and an output of the second hysteresis comparator, and to generate the reset pulse.

In one embodiment, the first hysteresis comparator may include a first inversion hysteresis comparator that receives the first signal, and voltages corresponded to the thresholds of the first inversion circuit and the second inversion circuit. The second hysteresis comparator may include a second inversion hysteresis comparator that receives the second signal, and voltages corresponded to the thresholds of the first inversion circuit and the second inversion circuit.

In one embodiment, the first hysteresis comparator may include a first Schmitt trigger inverter that receives the first signal. The second hysteresis comparator may include a second Schmitt trigger inverter that receives the second signal.

In one embodiment, the thresholds of the first inversion circuit and the second inversion circuit may fall on a lower potential side of a midpoint voltage between a power supply voltage and a ground voltage, and a center of the decision voltage range may fall on a higher potential side of the midpoint voltage.

In one embodiment, the thresholds of the first inversion circuit and the second inversion circuit may fall on a higher potential side of a midpoint voltage between a power supply voltage and a ground voltage, and a center of the decision voltage range may fall on a lower potential side of the midpoint voltage.

EMBODIMENTS

Preferred embodiments will be explained below, referring to the attached drawings. All similar or equivalent constituents, members and processes illustrated in the individual drawings will be given same reference numerals, so as to properly avoid redundant explanations. The embodiments are merely illustrative and are not restrictive about the invention. All features and combinations thereof described in the embodiments are not always necessarily essential to the disclosure and invention.

In the present specification, a "state in which a member A is coupled to a member B" includes a case where the member A and the member B are physically and directly coupled, and a case where the member A and the member B are indirectly coupled while placing in between some other member that does not substantially affect the electrically coupled state, or does not degrade the function or effect demonstrated by the coupling thereof.

Similarly, a "state in which a member C is provided between the member A and the member B" includes a case where the member A and the member C, or the member B and the member C are directly coupled, and a case where they are indirectly coupled, while placing in between some other member that does not substantially affect the electrically coupled state among the members, or does not degrade the function or effect demonstrated by the members.

FIG. 1 is a circuit diagram of a semiconductor apparatus 200 having a power-on reset circuit 100 of an embodiment. The semiconductor apparatus 200 includes a circuit-to-be-initialized 210, in addition to the power-on reset circuit 100. The circuit-to-be-initialized 210 is a complementary metal oxide semiconductor (CMOS) circuit and includes a sequential circuit. The sequential circuit is a circuit whose current output is determined by its initial state and past input, and may include a flip-flop, a latch circuit, and the like. In a case where the circuit-to-be-initialized 210 is a digital circuit, a resettable D flip-flop can serve as a sequential target to be initialized.

The circuit-to-be-initialized 210 operates while powered by power supply voltage $V_{DD}$ supplied to a source pin $V_{DD}$ of the semiconductor apparatus 200. Since the flip-flop and the latch that constitute a combination circuit are undefined under low power supply voltage $V_{DD}$, so that an internal node of the circuit-to-be-initialized 210 is undefined under low power supply voltage $V_{DD}$.

The power-on reset circuit 100 asserts the reset pulse RST, upon powered on and over a period the circuit-to-be-initialized 210 stays undefined and resets the circuit-to-be-initialized 210. Upon elevation of the power supply voltage to stabilize the circuit-to-be-initialized 210, the power-on reset circuit 100 negates the reset pulse RST (reset cancellation). Now, assertion of the reset pulse RST in this specification is assigned H (high), but not limited thereto.

The power-on reset circuit 100 has a latch circuit 110 and a decision circuit 120. The latch circuit 110 is configured to reproduce a state (undefined/stable) of the sequential circuit such as a flip-flop or a latch circuit that constitutes the circuit-to-be-initialized 210. That is, a relationship established herein is that the latch circuit 110 is undefined if the sequential circuit of the circuit-to-be-initialized 210 is undefined, and that the sequential circuit of the circuit-to-be-initialized 210 is stable if the latch circuit 110 is stable.

The latch circuit 110 has a first inversion circuit 112 and a second inversion circuit 114. Each of the first inversion circuit 112 and the second inversion circuit 114 inverts and amplifies a signal input thereto. The first inversion circuit 112 and the second inversion circuit 114 are cross-coupled, in which an output node of the first inversion circuit 112 is connected to an input node of the second inversion circuit 114, and an output node of the second inversion circuit 114 is connected to an input node of the first inversion circuit 112.

The latch circuit 110 may include a replica structured fully identical to the flip-flop or the latch circuit that constitutes the circuit-to-be-initialized 210, may have substantially the same structure, or may have a different structure modified intentionally. The first inversion circuit 112 and the second inversion circuit 114 may be completely the same circuit element or may be different circuit elements.

The decision circuit 120 receives a first signal Q from the output node of the first inversion circuit 112 and a second signal QB from the output node of the second inversion circuit 114 and generates the reset pulse RST on the basis of the first signal Q and the second signal QB. Q is also referred to as a non-inverted output (or simply output) of the latch circuit 110, and QB is also referred to as an inverted output of the latch circuit 110. Note in the present specification that B appended to the end of the digital signal name indicates that the signal is inverted from a signal denoted by the previous character string.

The structure of the power-on reset circuit 100 has been described. Next, operations thereof will be explained.

Figure 2:
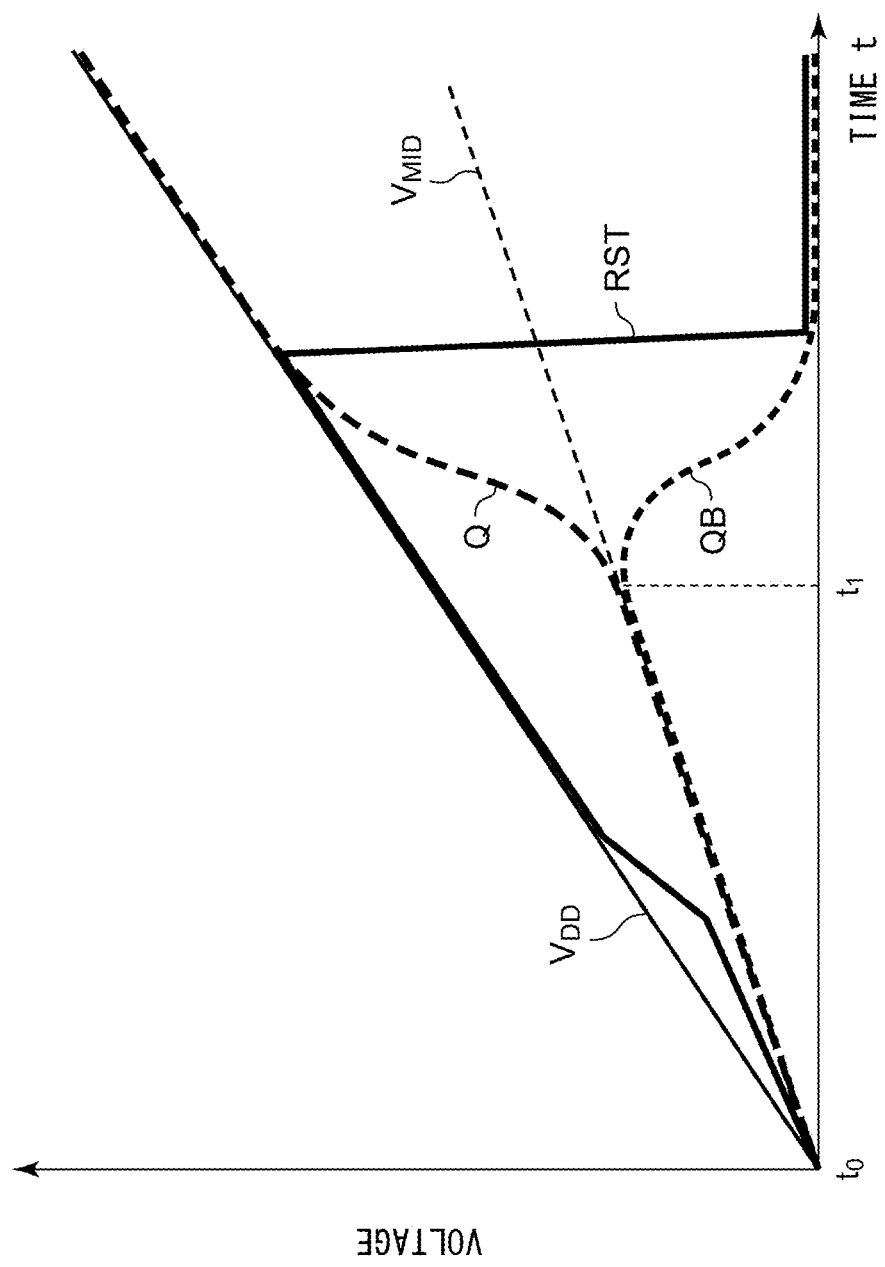
FIG. 2 is an operation waveform chart of the semiconductor apparatus illustrated in FIG. 1, when activated.

FIG. 2 is an operation waveform chart of the semiconductor apparatus 200 illustrated in FIG. 1, when activated. The abscissa plots time, and the ordinate plots voltage level. FIG. 2 illustrates the power supply voltage $V_{DD}$, the first signal Q, the second signal QB, and the reset pulse RST.

Upon powered on at time to, the power supply voltage $V_{DD}$ increases with time. Under a low power supply voltage $V_{DD}$ upon powered on, the first inversion circuit 112 and the second inversion circuit 114 have small gains (absolute values A), and the output Q and the inverted output QB of the latch circuit 110 fall on an intermediate potential $V_{MID}$, which is neither H (high, $V_{DD}$) nor L (low, 0 V). The intermediate potential $V_{MID}$ is a voltage that corresponds to the threshold voltage of the first inversion circuit 112 and the second inversion circuit 114.

When the power supply voltage $V_{DD}$ becomes high, and the absolute values A of the gains of the first inversion circuit 112 and the second inversion circuit 114 become A»1, one of the output Q or the inverted output QB (Q, in this case) of the latch circuit 110 transitions towards H, and the other (QB, in this case) transitions towards L ($t_1$ and thereafter). The latch circuit 110 is then stabilized in a state represented by Q=H and QB=L. In which state the latch circuit 110 becomes stable is determined by the structure of the latch circuit 110, or stochastically.

When the first signal Q and the second signal QB have the intermediate potential $V_{MID}$, the decision circuit 120 asserts the reset signal RST (H, $V_{DD}$), assuming that the latch circuit 110 is undefined, or, the circuit-to-be-initialized 210 is undefined. When the first signal Q and the second signal QB deviate from the intermediate potential $V_{MID}$, the decision circuit 120 negates the reset signal RST (L, 0 V), assuming that the latch circuit 110 transitioned to the stable state, or the circuit-to-be-initialized 210 transitioned to the stable state. While triggered by the assertion of the reset signal RST, the sequential circuit inside the circuit-to-be-initialized 210 is initialized, and the resetting is canceled by negation of the reset signal RST (power-on reset).

The semiconductor apparatus 200 is thus operated.

The power-on reset circuit 100, having provided thereto the latch circuit 110 that simulates a sequential circuit that constitutes the circuit-to-be-initialized 210, can keep the reset pulse RST asserted when the latch circuit 110 is undefined, or, when also the circuit-to-be-initialized 210 is undefined, and can negate the reset pulse RST when the latch circuit 110 becomes stable, or, when the circuit-to-be-initialized 210 becomes stable, to cancel resetting of the circuit-to-be-initialized 210. Since there is no need to save a large margin as in the voltage scheme or the delay scheme, so that resetting of the circuit-to-be-initialized 210 may be triggered and cancelled earlier than before.

The present disclosure may be understood by the block diagram of FIG. 1 or circuit diagrams, and encompasses various apparatuses and methods derived from the foregoing explanations, but not limited to a specific structure. Hereinafter, more specific exemplary structures and examples will be described to help understanding or to clarify the spirit or operations of the present disclosure, without narrowing the scope of the present disclosure.

Example 1

Figure 3:
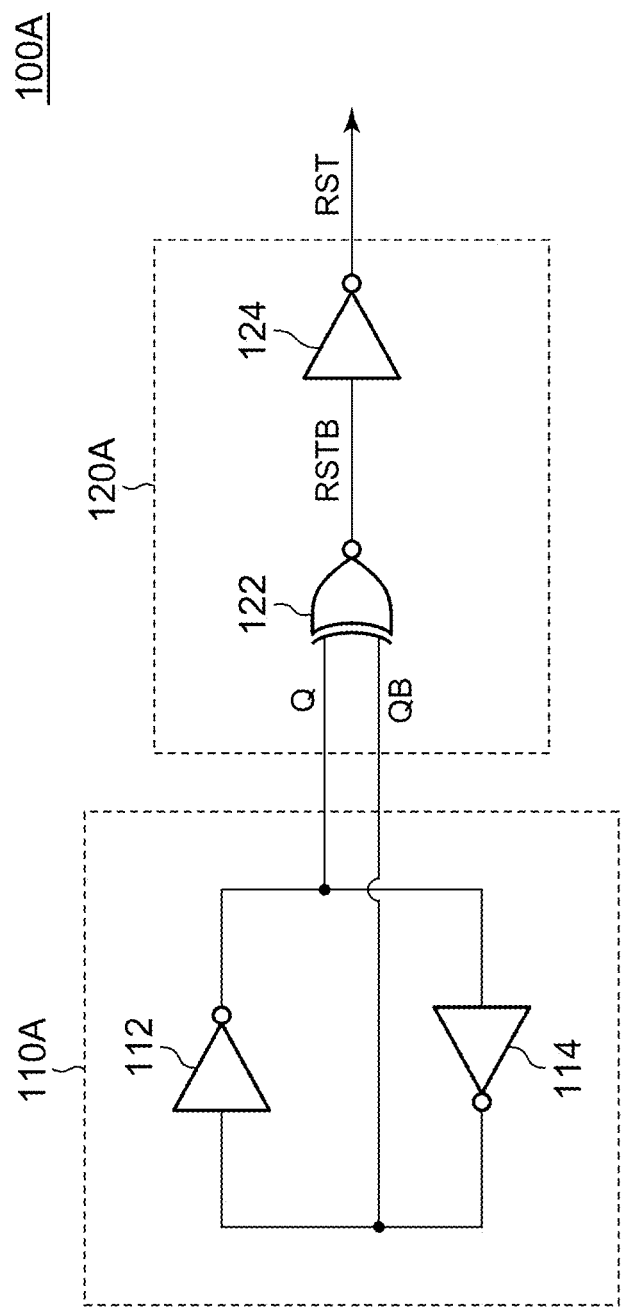
FIG. 3 is a circuit diagram of a power-on reset circuit of Example 1.

FIG. 3 is a circuit diagram of a power-on reset circuit 100A of Example 1. The power-on reset circuit 100A has a latch circuit 110A and a decision circuit 120A.

The first inversion circuit 112 and the second inversion circuit 114 of the latch circuit 110A are CMOS inverters.

When the first signal Q and the second signal QB match, the decision circuit 120A asserts the reset pulse RST, assuming that the latch circuit 110 (or, the circuit-to-be-initialized 210) is undefined. The decision circuit 120A includes an XOR (exclusive OR) gate 122 and an inverter 124. The XOR gate 122 receives the first signal Q and the second signal QB and generates an inverted reset pulse RSTB that becomes L when their logic levels match and becomes H when their logic levels do not match. The inverter 124 inverts the inverted reset pulse RSTB and generates a reset pulse RST.

The structure of the power-on reset circuit 100A has been described. Next, operations thereof will be explained.

Figure 4:
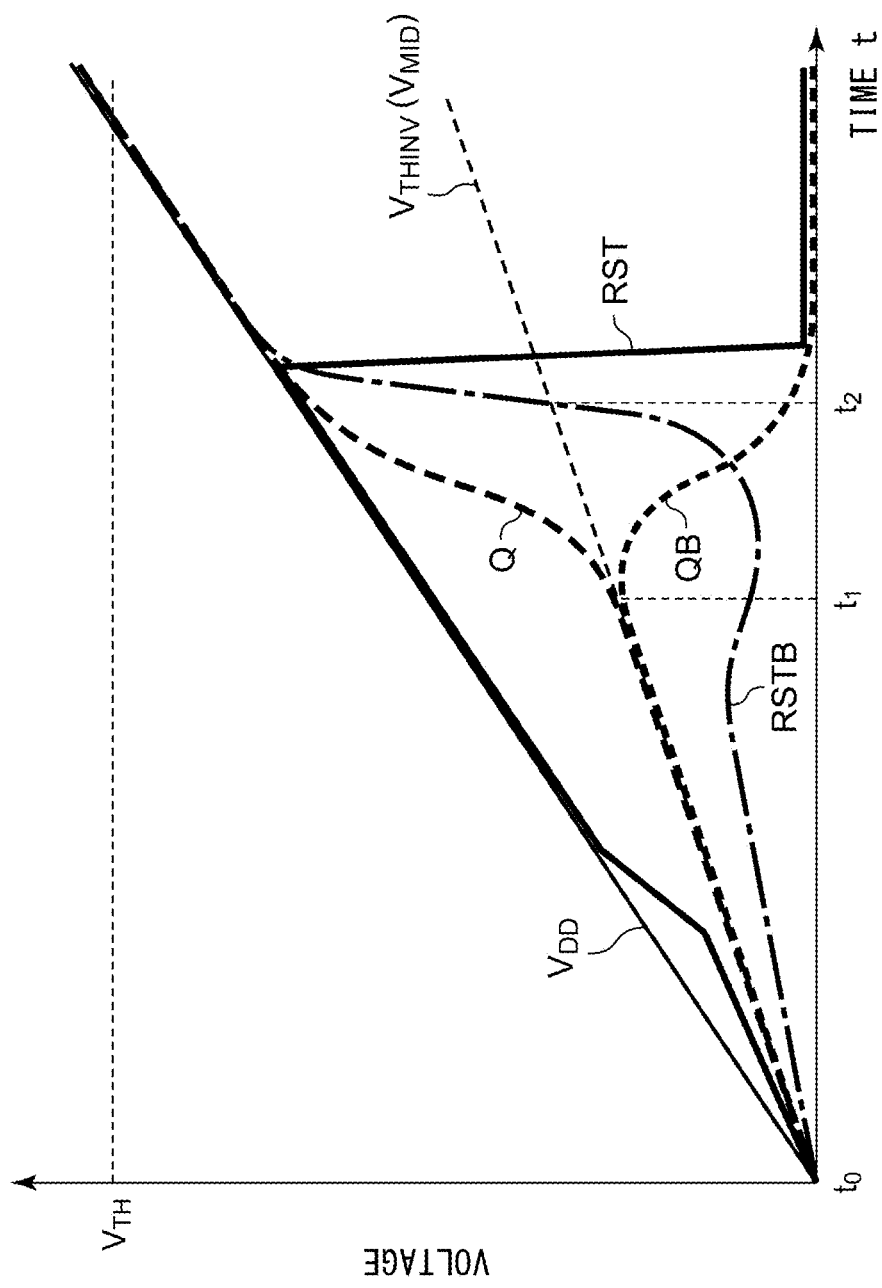
FIG. 4 is an operation waveform chart of the power-on reset circuit illustrated in FIG. 3.

FIG. 4 is an operation waveform chart of the power-on reset circuit 100A illustrated in FIG. 3. Upon powered on at time to, the power supply voltage $V_{DD}$ increases with time. Under a low power supply voltage $V_{DD}$ upon powered on, the first inversion circuit 112 and the second inversion circuit 114 have small gains (absolute values A), and the output Q and the inverted output QB of the latch circuit 110 fall on an intermediate potential $V_{MID}$, which is neither H (high, $V_{DD}$) nor L (low, 0 V). In a case where the first inversion circuit 112 and the second inversion circuit 114 are constituted by CMOS inverters having matched characteristics, the output Q and the inverted output QB are balanced, with the threshold voltage $V_{THINV}$ of the CMOS inverters kept at the intermediate potential $V_{MID}$. Note that in a case where the two CMOS inverters have different characteristics, the output Q and the inverted output QB of the latch circuit 110 will have voltage levels deviated from the threshold $V_{THINV}$.

When the power supply voltage $V_{DD}$ becomes high, and the absolute values A of the gains of the first inversion circuit 112 and the second inversion circuit 114 become A»1, one of the output Q or the inverted output QB (Q, in this case) of the latch circuit 110 transitions towards H, and the other (QB, in this case) transitions towards L ($t_1$ and thereafter). The latch circuit 110 is then stabilized in a state represented by Q=H and QB=L.

An output RSTB of the XOR gate 122 has a voltage level lower than the threshold voltage $V_{THINV}$ of the inverter 124 in the subsequent stage while Q=QB=$V_{THINV}$ holds, meanwhile the inverted reset pulse RSTB, which is an output of the XOR gate 122, transitions to H ($V_{DD}$), as the potential difference between the two inputs Q and QB increases. Upon excess of the inverted reset pulse RSTB over the threshold voltage $V_{THINV}$ of the inverter 124 at time $t_2$, the reset pulse RST becomes L (negated), and the resetting is canceled.

The power-on reset circuit 100A thus operates. The power-on reset circuit 100A can trigger or cancel the resetting earlier than in the prior voltage scheme or the delay scheme.

In addition, since the latch circuit 110A and the decision circuit 120A are constituted by digital circuits, so that the power-on reset circuit 100A can operate at lower voltages as compared with the prior structure with use of an analog voltage comparator.

Figure 5:
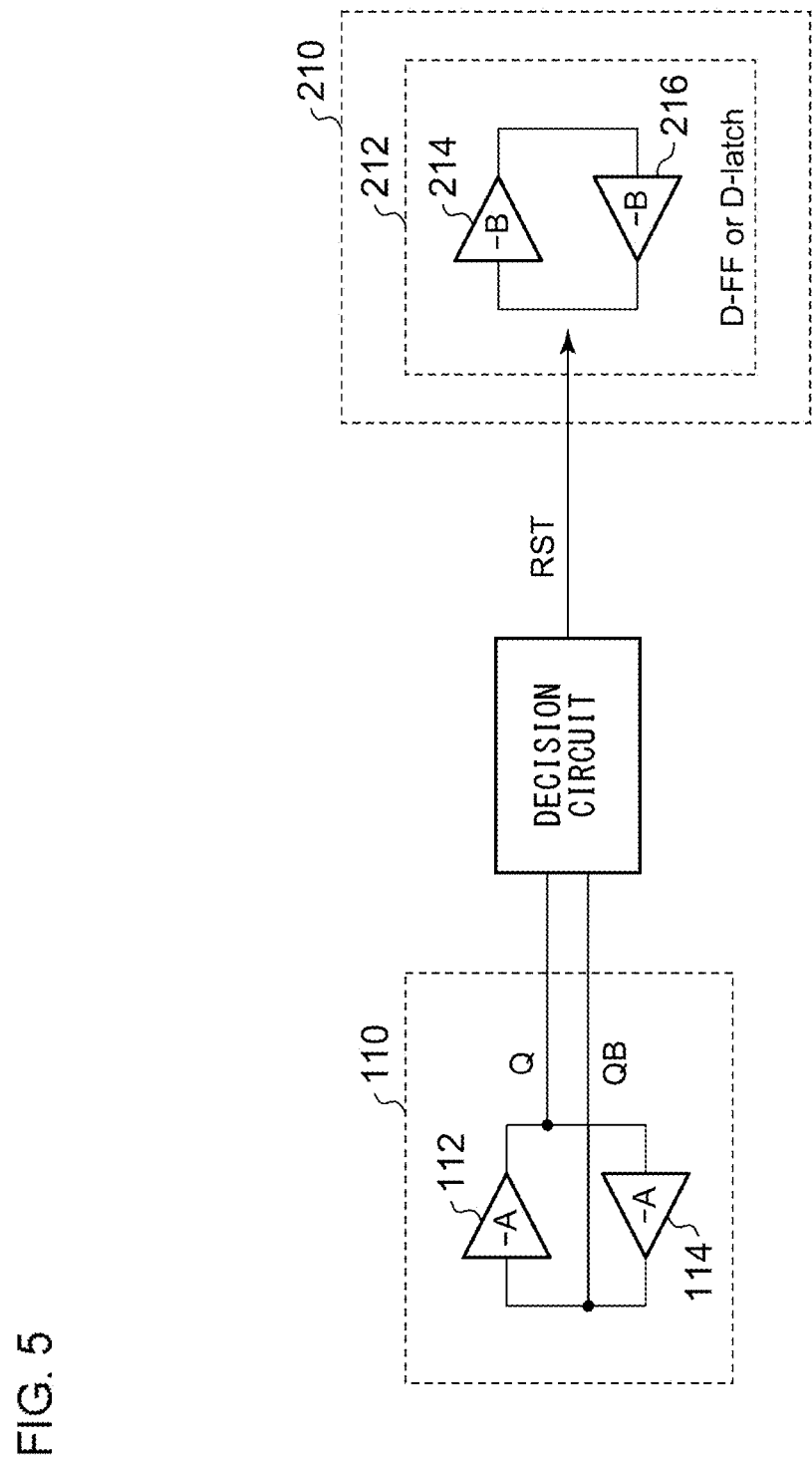
FIG. 5 is a drawing illustrating a gain of a latch circuit illustrated in FIG. 1.

Next, the gain of the latch circuit 110 will be described. FIG. 5 is a drawing for explaining the gain of the latch circuit 110.

In order to correctly reset the sequential circuit (including latch, flip-flop, and memory device) of the circuit-to-be-initialized 210 according to the state of the latch circuit 110, a relationship necessarily established is that the latch circuit 110 is undefined if the sequential circuit of the circuit-to-be-initialized 210 is undefined, and that the sequential circuit of the circuit-to-be-initialized 210 is stable if the latch circuit 110 is stable.

Also the flip-flop and the latch circuit used as a sequential circuit 212 of the circuit-to-be-initialized 210 include a pair of cross-coupled inversion circuits 214, 216, similarly to the latch circuit 110 of the power-on reset circuit 100. More specifically, the sequential circuit 212 may be a latch having two inverters cross-coupled, an SR latch having two NOR (negative OR) gates cross-coupled, a D latch, a D flip-flop, or a resettable D flip-flop.

For establishment of the foregoing relation, the gain A (absolute value) of the latch circuit 110 of the power-on reset circuit 100 is desirably equal to or smaller than the gain B of the sequential circuit contained in the circuit-to-be-initialized 210.

$$A \leq B \quad (1)$$

The gain A of the latch circuit 110 is the gain of the cross-coupled inversion circuits 112 and 114, meanwhile the gain B of the sequential circuit 212 of the circuit-to-be-initialized 210 is the gain of the cross-coupled inversion circuits 214 and 216.

Now, as the size (shape ratio W/L) of the transistor that constitutes the inversion circuit becomes smaller, the gains A and B become lower. In addition, the gains A and B of the latch circuit 110 and the sequential circuit of the circuit-to-be-initialized 210, respectively, decrease as the number of levels of vertically-stacked transistors that constitute the inversion circuit increases. For example, the number of levels of vertically stacked CMOS inverters is two, the number of levels of a buffer with enable function (tri-state buffers) is three or four, the number of levels of a two-input NOR gates is three, and the number of levels of a three-input NOR gates is four.

Assuming, for example, that the sequential circuit 212 of the circuit-to-be-initialized 210 is a D latch or a D flip-flop constituted by cross-coupled tri-state buffers (enabled buffers). The tri-state buffer is constituted by four transistors vertically stacked between a power supply line and a ground line. Alternatively, assuming as illustrated in FIG. 3 that the first inversion circuit 112 and the second inversion circuit 114 are constituted by CMOS inverters having two vertically stacked transistors. If the size of the transistor that constitutes the sequential circuit 212 is the same as the size of the transistor that constitutes the latch circuit 110, the relation will be $$A > B,$$

which fails to satisfy the relational expression (1). This means that, upon powered on, the latch circuit 110 transitions from the undefined state to the stable state earlier than the sequential circuit 212. In other words, the reset pulse RST can be negated (resetting is canceled) even if the sequential circuit 212 stays undefined.

Since B in the relational expression (1) is a preset design condition, so that the gain A of the latch circuit 110 is necessarily lowered to make the relational expression (1) hold. This may be accomplished by employing any of approaches including (i) increasing the number of levels of vertically stacked transistors that constitute the first inversion circuit 112 and the second inversion circuit 114, (ii) reducing the shape ratio (gate width W/gate length L) of the transistors, and (iii) increasing the number of levels, as well as increasing the shape ratio.

Example 2

In Example 2, an approach of lowering the gain of the latch circuit 110 will be described.

Figure 6:
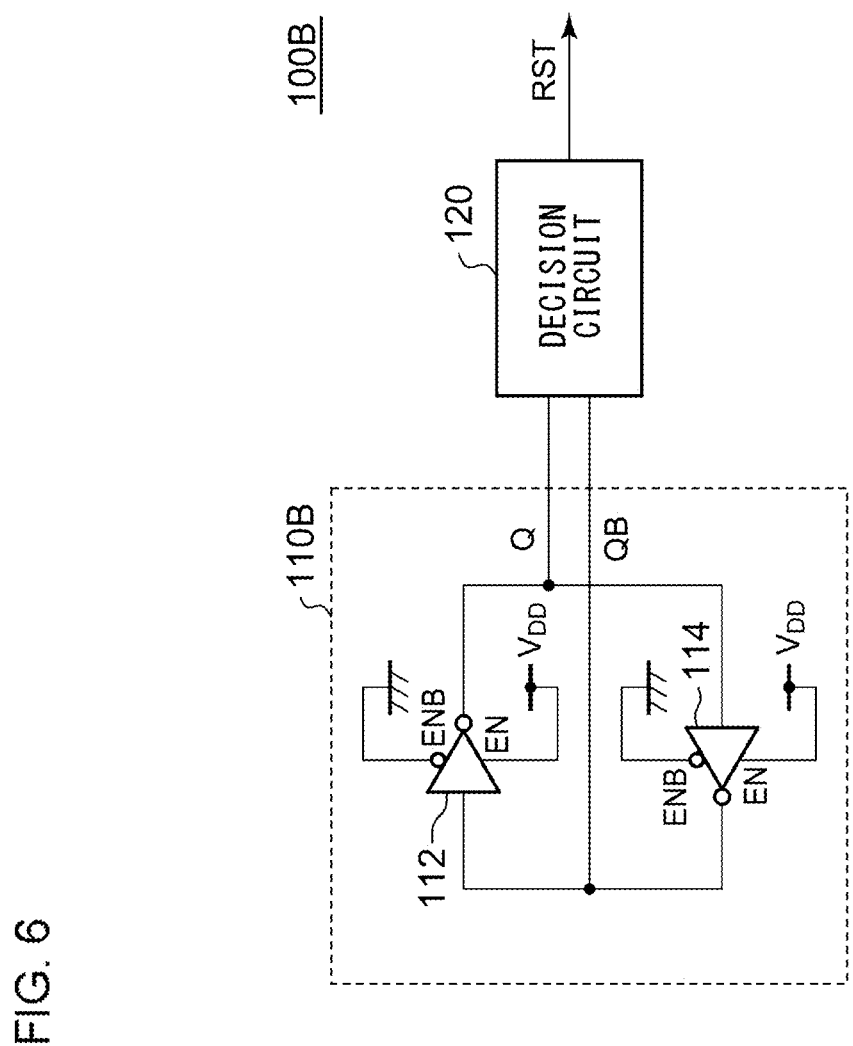
FIG. 6 is a circuit diagram of a power-on reset circuit of Example 2.

FIG. 6 is a circuit diagram of a power-on reset circuit 100B of Example 2. The first inversion circuit 112 and the second inversion circuit 114 that constitute the latch circuit 110B are tri-state buffers (buffers with enable function), each having an enable terminal EN and an inverted enable terminal ENB. The tri-state buffer usually has three or four levels of vertically stacked transistors, wherein the number of levels is larger than in the CMOS inverter having two levels. The enable terminal EN and the inverted enable terminal ENB of each of the first inversion circuit 112 and the second inversion circuit 114 are fixed to high and low, respectively.

Figure 7:
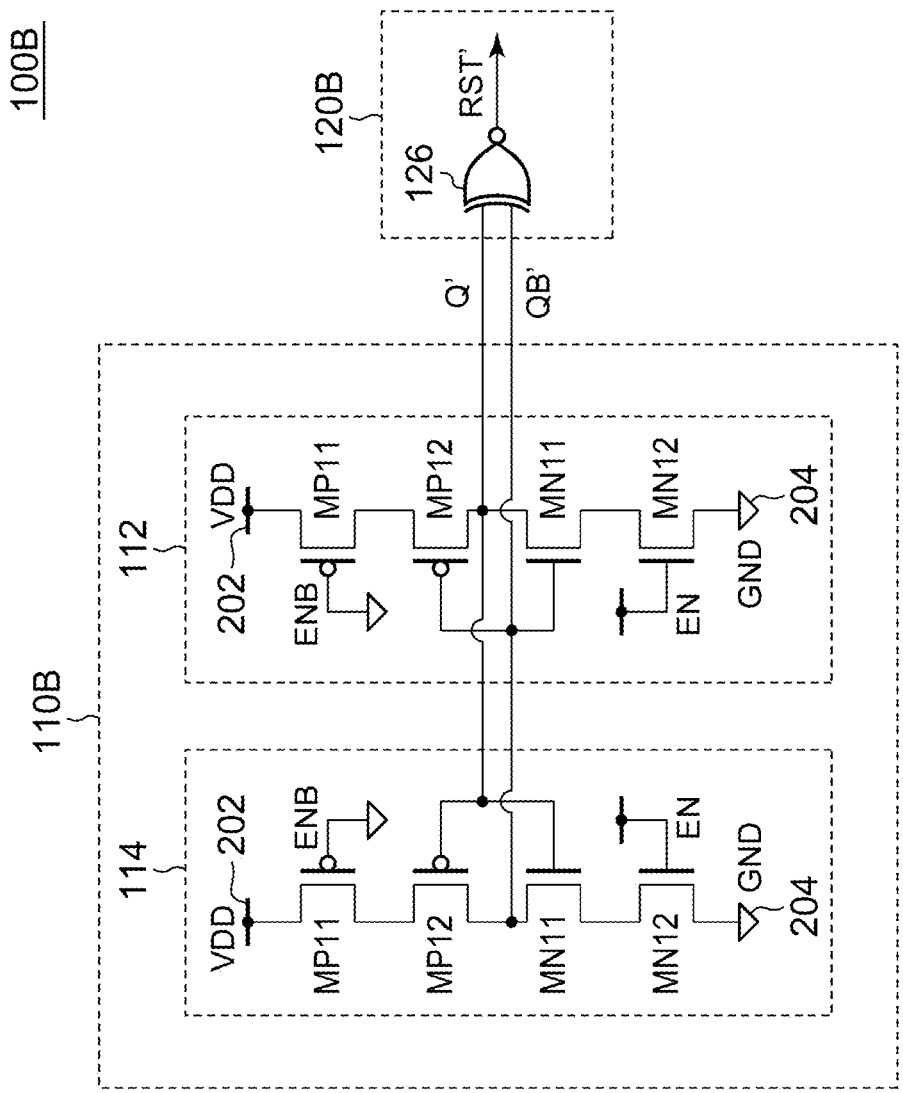
FIG. 7 is a circuit diagram of a specific example of the power-on reset circuit illustrated in FIG. 6.

FIG. 7 is a circuit diagram of a specific example of the power-on reset circuit 100B illustrated in FIG. 6.

The first inversion circuit 112 and the second inversion circuit 114 are tri-state buffers, each containing four transistors MP11, MP12, MN1, and MN12 stacked vertically between a power supply line 202 and a ground line 204. The P-channel transistors MP11 and MP12 are connected in series between the power supply line 202 and an output node, and the N-channel transistors MN11 and MN12 are connected in series between the output node and the ground line 204.

The gate of the transistor MP11 is an inverted enable terminal ENB fixed to L, and the gate of the transistor MN12 is an enable terminal EN fixed to H. This structure, having four levels of vertically stacked transistors, can lower the gain, as compared with a CMOS inverter constituted by transistors of the same size.

Although this example depicts a case where the gates of the transistors MP11 and MN12 are connected to the enable terminals ENB and EN, respectively, the connection is not limited thereto. The gate of the transistor MP12 may alternatively be connected to the enable terminal ENB, or the gate of the transistor MN11 may be connected to the enable terminal EN.

Alternatively, the number of levels of vertical stack may be reduced to three, by omitting the transistor MP11 and the inverted enable terminal ENB, or by omitting the transistor MN12 and the enable terminal EN.

Also a decision circuit 120B has a structure different from that in Example 1 and has an XNOR (exclusive NOR) gate 126.

Figure 8:
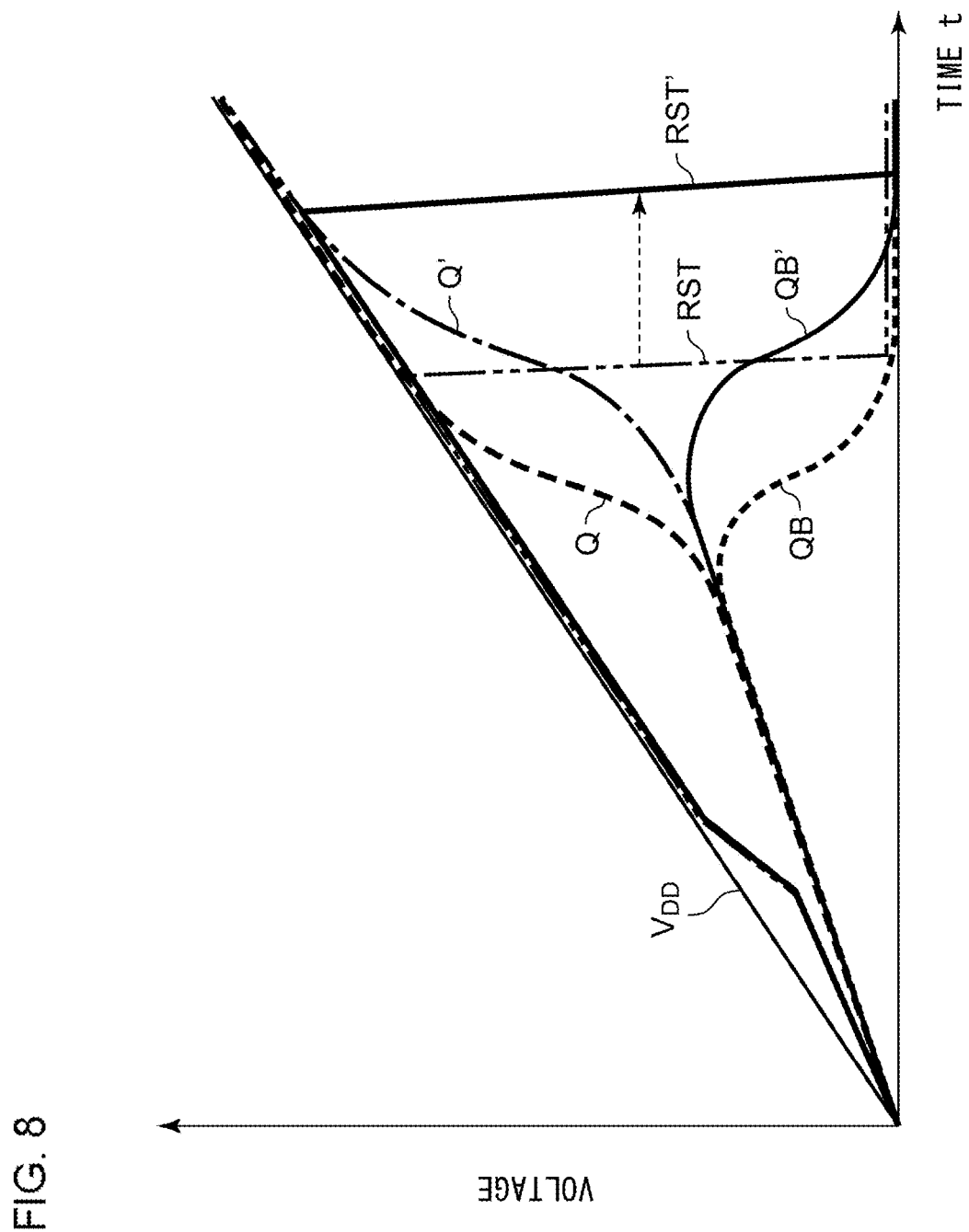
FIG. 8 is an operation waveform chart of the power-on reset circuit illustrated in FIG. 7.

FIG. 8 is an operation waveform chart of the power-on reset circuit 100B illustrated in FIG. 7. Operation of the power-on reset circuit 100B illustrated in FIG. 7 is indicated by solid lines, with a single prime (') attached to each signal name. For comparison, operation of the power-on reset circuit 100A illustrated in FIG. 3, having the same element size, is indicated by broken lines.

In the power-on reset circuit 100B of FIG. 7, the first inversion circuit 112 and the second inversion circuit 114 have the gains lower than those in FIG. 3. The first inversion circuit 112 and the second inversion circuit 114 in Example 2, therefore, require higher power supply voltages $V_{DD}$ enough to establish the gains (A»1), than in Example 1. This successfully shifts the power supply voltage $V_{DD}$ at which the reset pulse RST' is negated (resetting is canceled), towards the high potential side.

In this way, the power supply voltage $V_{DD}$ at which the reset pulse RST' is negated (resetting is canceled) may be freely determined, by increasing the number of levels of vertically stacked transistors in the first inversion circuit 112 and the second inversion circuit 114.

Example 3

Figure 9:
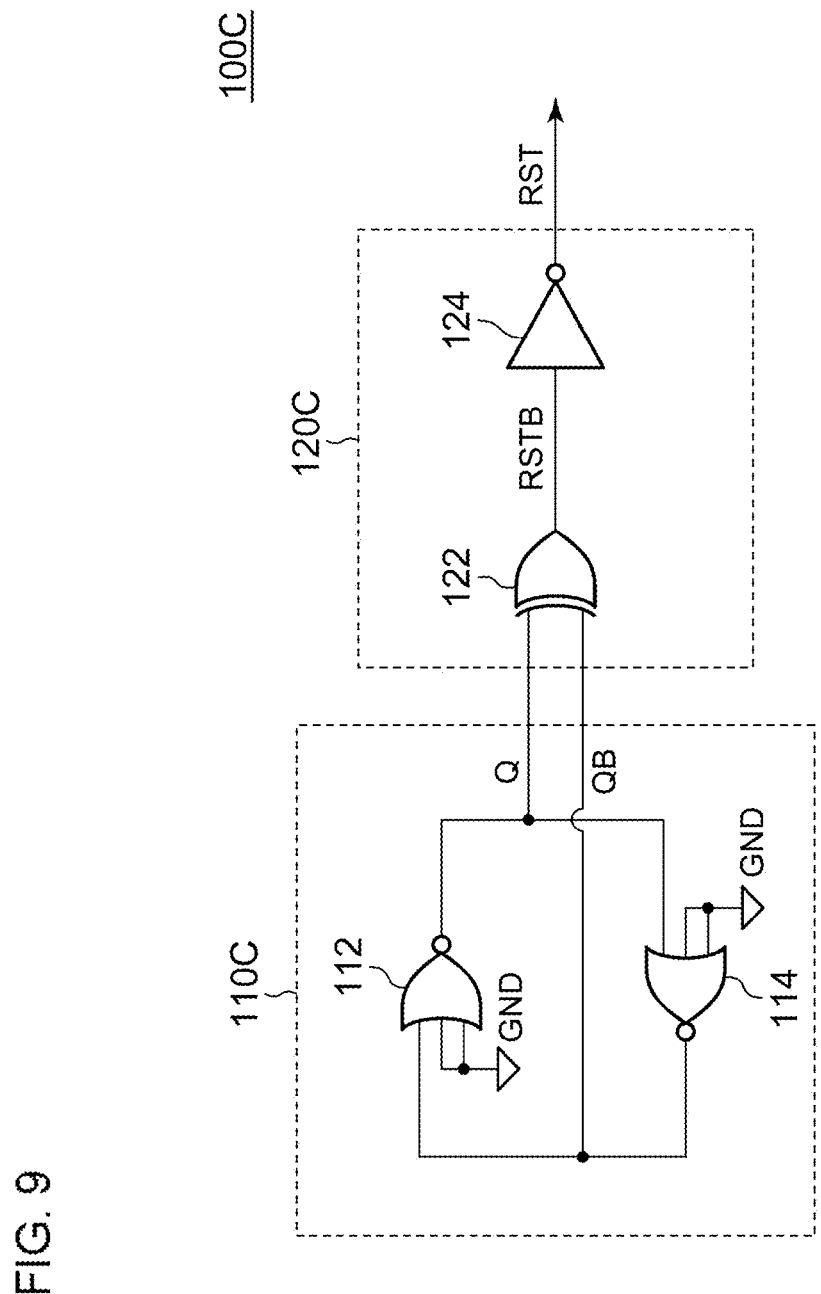
FIG. 9 is a circuit diagram of a power-on reset circuit of Example 3.

FIG. 9 is a circuit diagram of a power-on reset circuit 100C of Example 3. The first inversion circuit 112 and the second inversion circuit 114 that constitute a latch circuit 110C are three-input NOR gates. In FIG. 9, two inputs from among the three inputs of the NOR gate are fixed to L (0 V, GND), and, to the residual one input, an output of the other NOR gate is connected.

Figure 19:
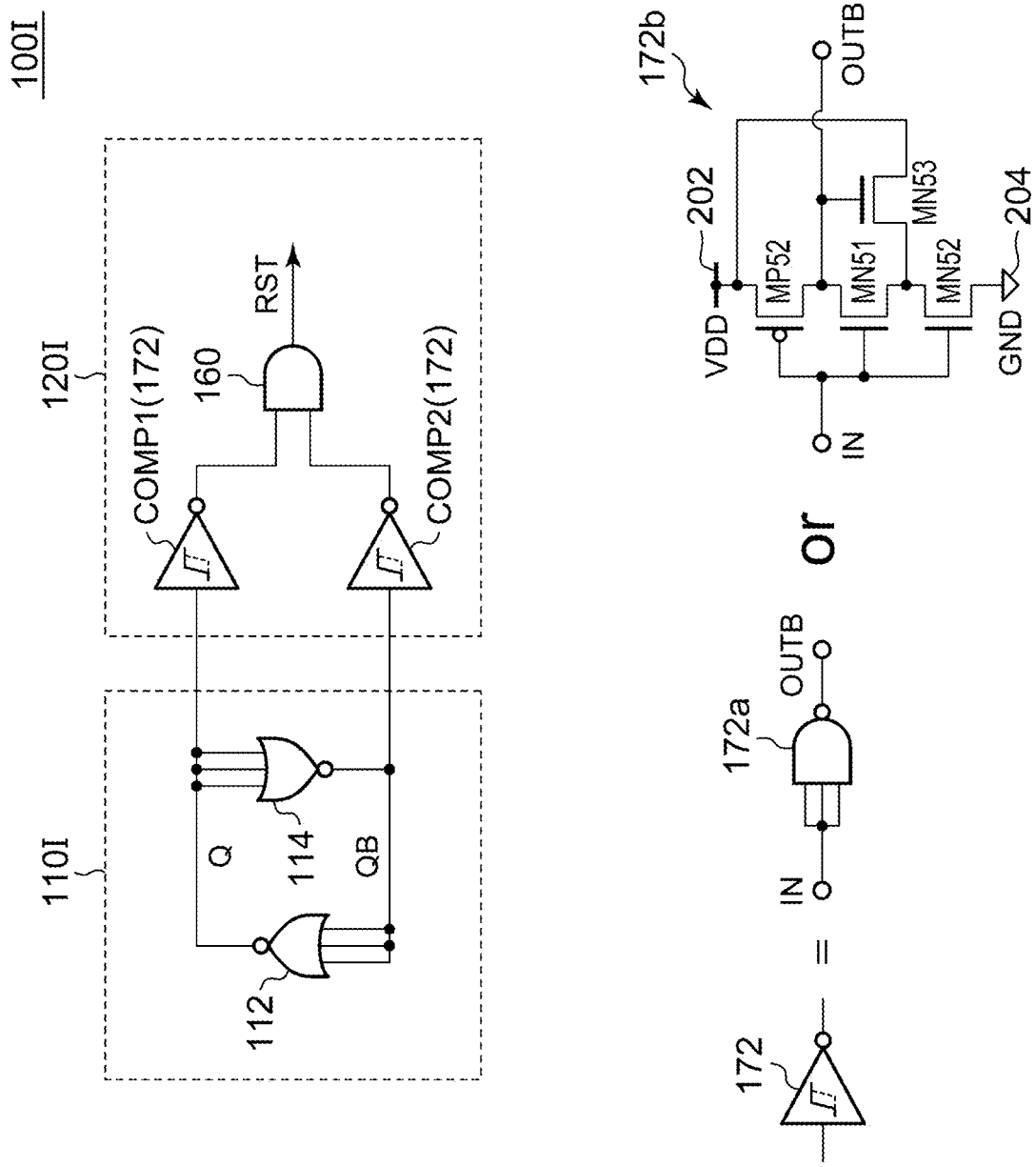
FIG. 19 is a circuit diagram of a power-on reset circuit of Example 6.

Note that the connection of the three inputs of the NOR gates are freely selectable, wherein all of the three inputs may be connected to the output of the other NOR gate, as illustrated in FIG. 19. The reset cancellation voltage can shift depending on mode of connection of the three inputs of the NOR gates, an may be maximized when the three inputs are commonized.

The decision circuit 120C, structured now similarly to the decision circuit 120A, may alternatively be structured as the decision circuit 120B. The different forms of the latch circuit 110 illustrated in the various drawings and the different forms of the decision circuit 120 illustrated in the various drawings may be freely combined.

Figure 10:
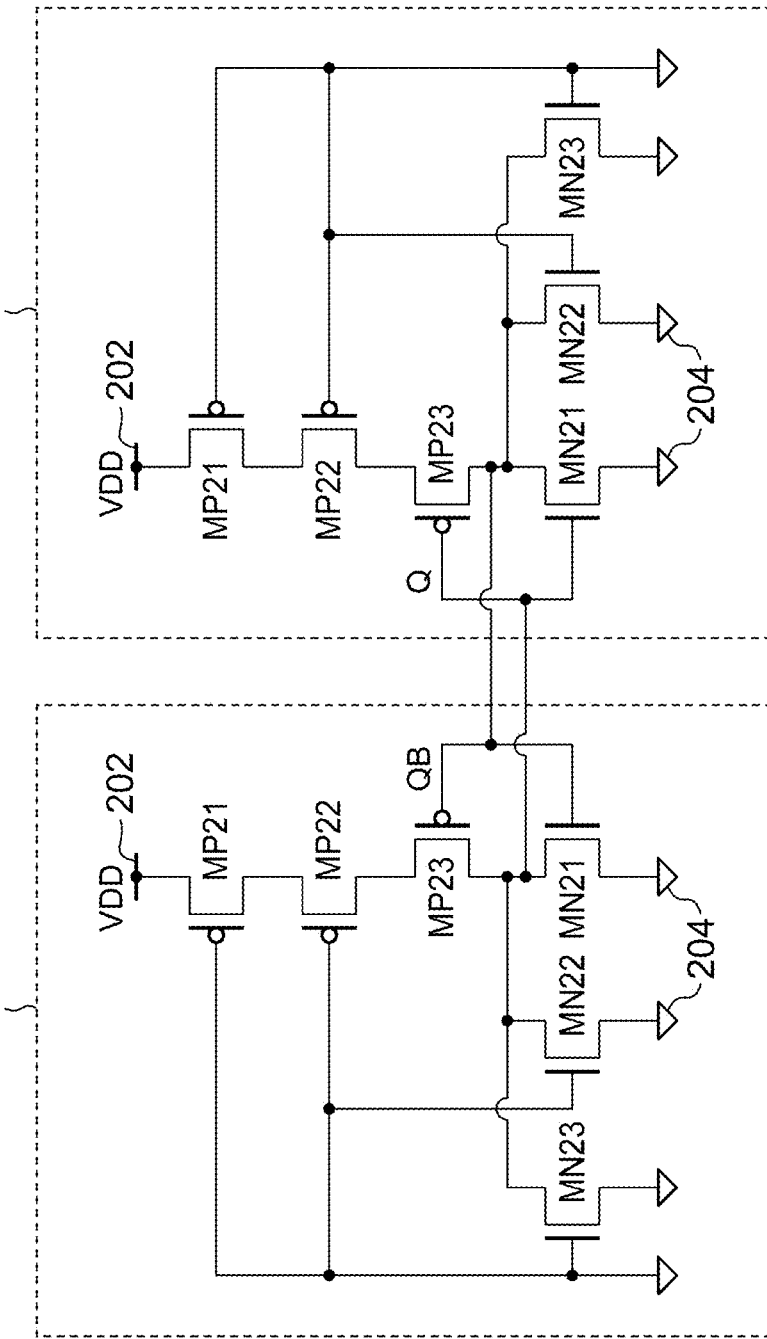
FIG. 10 is a circuit diagram of a specific example of a latch circuit illustrated in FIG. 9.

FIG. 10 is a circuit diagram of a specific example of the latch circuit 110C illustrated in FIG. 9.

The first inversion circuit 112 and the second inversion circuit 114 are NOR gates, and each contains P-channel transistors MP21 to MP23, and N-channel transistors MN21 to MN23. Each NOR gate has four levels of vertically stacked transistors (MP21, MP22, MP23, MN21), between the power supply line 202 and the ground line 204.

Comparing now the NOR gate illustrated in FIG. 10 with the tri-state buffer illustrated in FIG. 7, both have four levels of vertically stacked transistors, so that the gain of the latch circuit 110C will be lower than that of the CMOS inverter. Hence, similarly to Example 2, Example 3 will be more likely to establish the relational expression (1), when the gain B of the sequential circuit 212 of the circuit-to-be-initialized 210 is low.

Note now the NOR gate illustrated in FIG. 10 differs from the tri-state buffer illustrated in FIG. 7, in the following aspect. The tri-state buffer illustrated in FIG. 7 has two levels of transistors between the power supply line 202 and the output node (referred to as high-side transistors, hereinafter), and equally has two levels of transistors between the output node and the ground line 204 (referred to as low-side transistors, hereinafter). This locates the voltage levels (intermediate potential, or threshold voltage) of the two outputs Q and QB of the tri-state buffer in the undefined states, near the midpoint voltage $V_{DD}/2$ between the power supply voltage $V_{DD}$ and the ground voltage 0 V.

In contrast, the NOR gate illustrated in FIG. 10 has three levels of high-side transistors connected between the power supply line 202 and the output node, and unequally has one level of low-side transistor connected between the output node and the ground line 204. This locates the voltage levels (intermediate potential, or threshold voltage) of the two outputs Q and QB of the NOR gate in the undefined states, on the lower potential side of the midpoint voltage $V_{DD}/2$. This makes the decision circuit 120C in the subsequent stage more easily determine whether the latch circuit 110C is in the undefined state or in the stable state.

Figure 11:
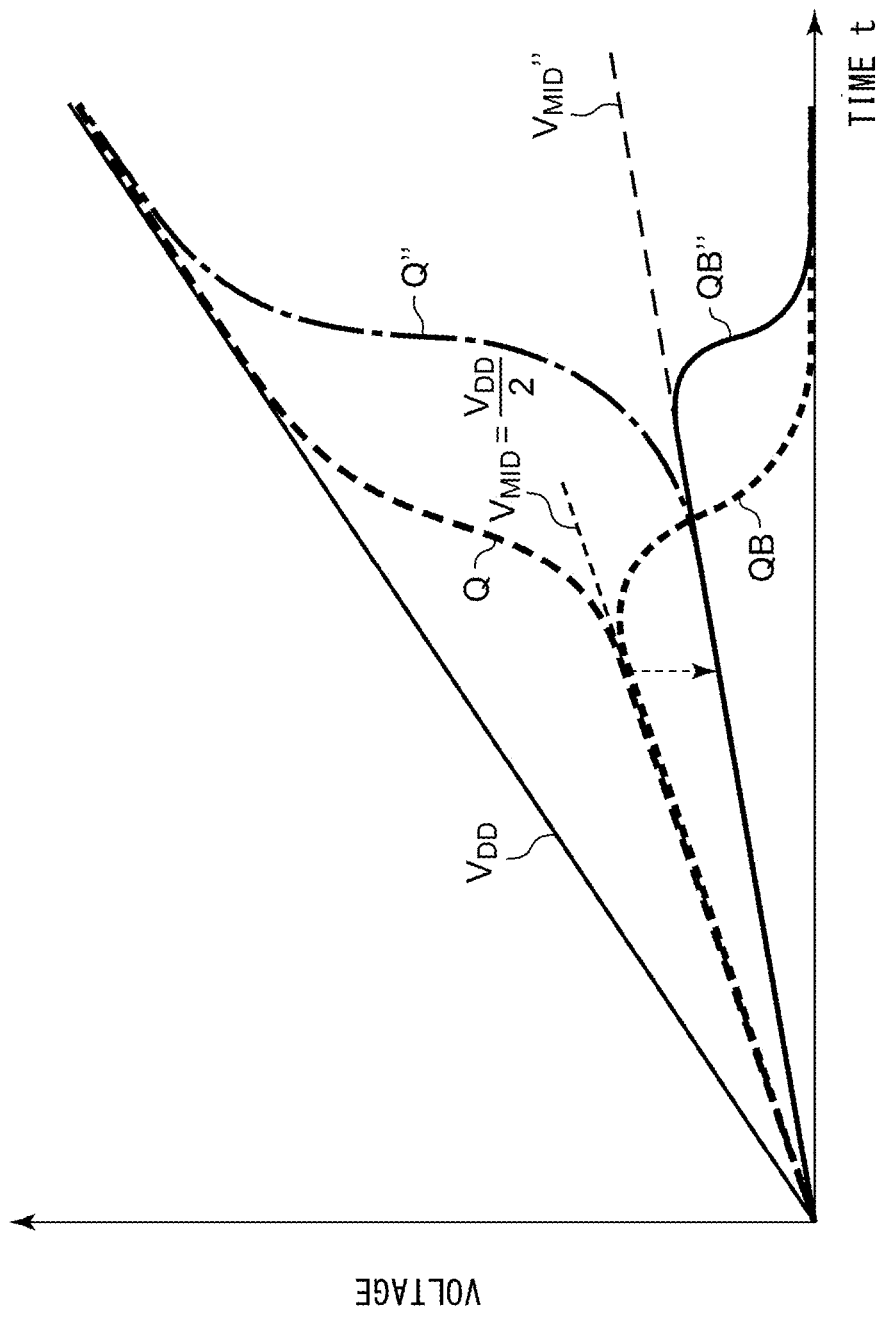
FIG. 11 is an operation waveform chart of a latch circuit illustrated in FIG. 10.

FIG. 11 is an operation waveform chart of the latch circuit 110C illustrated in FIG. 10. Operation of the latch circuit 110C is indicated by solid lines, with a double-prime (") attached to each signal name. For comparison, operation of the latch circuit 110A illustrated in FIG. 3, having the same element size, is indicated by broken lines.

In the latch circuit 110C of FIG. 9, the first inversion circuit 112 and the second inversion circuit 114 have the gains lower than those in FIG. 3. The first inversion circuit 112 and the second inversion circuit 114 in Example 3, therefore, require higher power supply voltages $V_{DD}$ enough to establish the gains (A»1), than in Example 1. This successfully shifts the power supply voltage $V_{DD}$ at which the reset pulse RST' is negated (resetting is canceled), towards the high potential side.

Moreover, since the inversion circuits 112 and 114 in the latch circuit 110A of FIG. 3 have one level of high-side transistor and equally one level of low-side transistor, so that the two outputs Q and QB will be $V_{DD}/2$ in the undefined state.

In contrast, since the inversion circuits 112 and 114 in the latch circuit 110C illustrated in FIG. 10 have the high-side transistors, whose number of levels is larger than the number of levels of the low-side transistors, so that the threshold voltages $V_{TH}$ thereof will be lower than the midpoint voltage $V_{DD}/2$. This makes the two outputs Q and QB have the intermediate voltage $V_{MID}"$ lower than $V_{DD}/2$. This makes the decision circuit 120C in the subsequent stage more easily determine whether the latch circuit 110C is in the undefined state or in the stable state.

Figure 12:
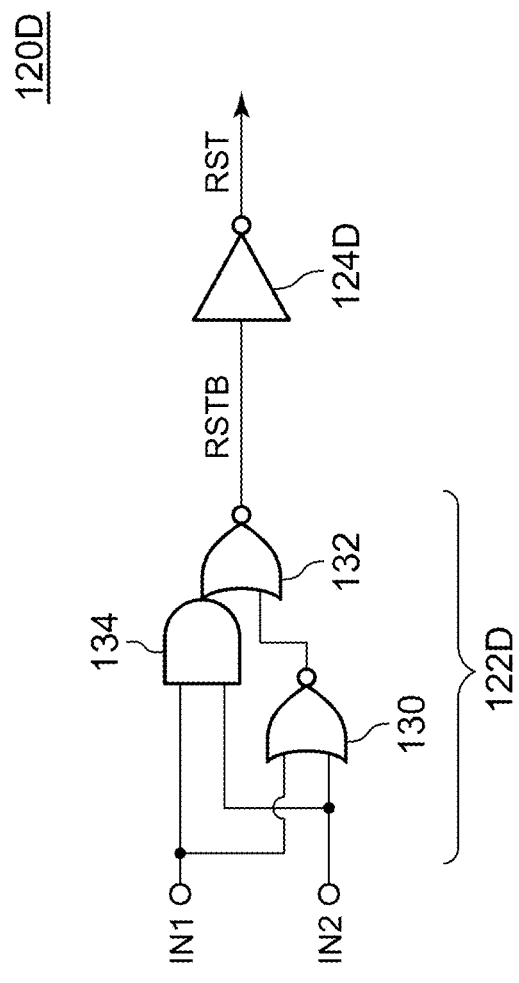
FIG. 12 is a circuit diagram illustrating a basic structure of a decision circuit.

Next, the structure of the decision circuit 120 will be described. FIG. 12 is a circuit diagram illustrating a basic structure (120D) of the decision circuit 120. The decision circuit 120D contains a composite gate 122D and an inverter 124D. The composite gate 122D contains two NOR gates 130,132 and an AND gate 134 and is logically equivalent to an XOR gate. The decision circuit 120D is structurally ill-balanced due to two asymmetrical inputs IN1 and IN2 of the composite gate 122D in the first stage and would erroneously output the inverted reset pulse RSTB when the latch circuit 110 in the previous stage is undefined, thus leaving room for improvement.

Figure 13:
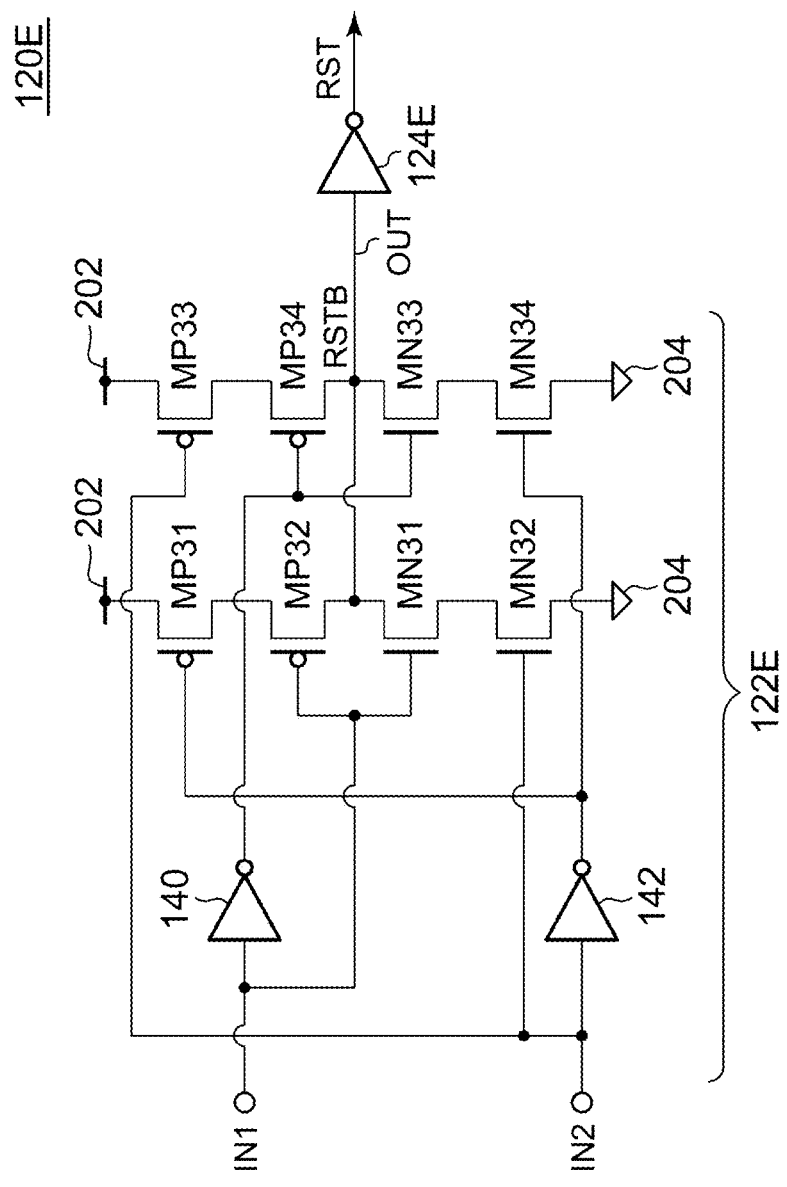
FIG. 13 is a circuit diagram illustrating an improved structure of the decision circuit.

FIG. 13 is a circuit diagram illustrating an improved structure (120E) of the decision circuit 120. The decision circuit 120E is an XNOR (exclusive NOR) gate that contains an XOR gate 122E and an inverter 124E. The XOR gate 122E in the former stage has a first input node IN1, a second input node IN2, an output node OUT, a first inverter 140, a second inverter 142, P-channel transistors MP31 to MP34, and N-channel transistors MN31 to MN34.

The first P-channel transistor MP31 and the second P-channel transistor MP32 are sequentially connected in series between the power supply line 202 and the output node OUT. The first N-channel transistor MN31 and the second N-channel transistor MN32 are sequentially connected in series between the output node OUT and the ground line 204.

The third P-channel transistor MP33 and the fourth P-channel transistor MP34 are sequentially connected in series between the power supply line 202 and the output node OUT. The third N-channel transistor MN33 and the fourth N-channel transistor MN34 are sequentially connected in series between the output node OUT and the ground line 204.

An input of the first inverter 140 is connected to the first input node IN1, and an output of the first inverter 140 is connected to the gate of the fourth P-channel transistor MP34 and the gate of the third N-channel transistor MN33. An input of the second inverter 142 is connected to the second input node IN2, and an output of the second inverter 142 is connected to the gate of the first P-channel transistor MP31 and the gate of the fourth N-channel transistor MN34. The gate of the second P-channel transistor MP32 and the gate of the first N-channel transistor MN31 are connected to the first input node IN1. The gate of the third P-channel transistor MP33 and the gate of the second N-channel transistor MN32 are connected to the second input node IN2.

Figure 14:
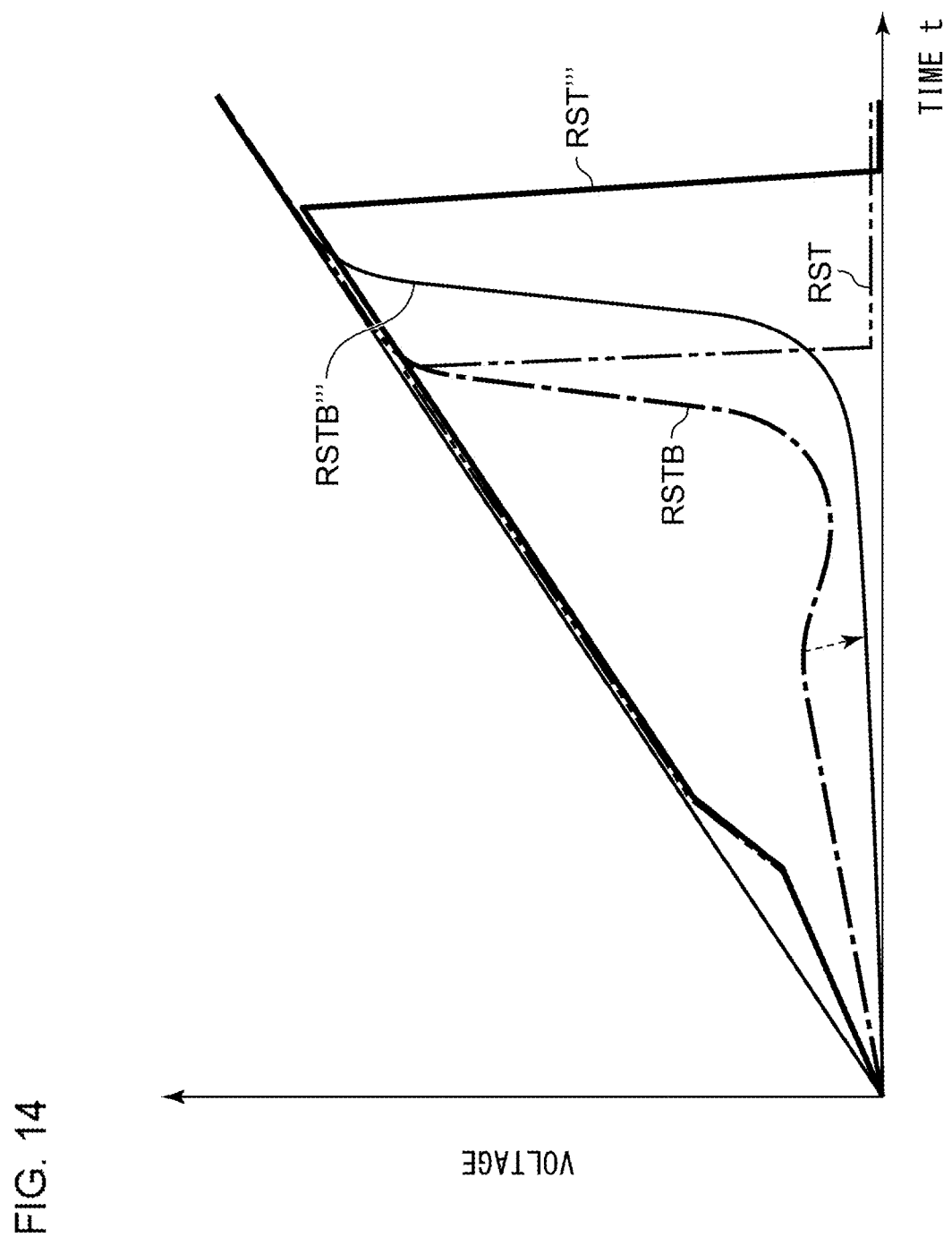
FIG. 14 is an operation waveform chart of the decision circuit illustrated in FIG. 13.

FIG. 14 is an operation waveform chart of the decision circuit 120E illustrated in FIG. 13. Operation of the decision circuit 120E illustrated in FIG. 14 is indicated by solid lines, with a triple-prime ("') attached to each signal name. For comparison, the operation of the decision circuit 120D illustrated in FIG. 12 is indicated by broken lines.

In the decision circuit 120D illustrated in FIG. 12, the inverted reset pulse RSTB, as an output of the composite gate 122D, would have an intermediate voltage higher than L (0 V) that can be safely determined by the inverter 124D, when the latch circuit 110 in the previous stage is undefined. Hence, although being correctly determined in FIG. 14, the reset pulse RST would otherwise be erroneously negated, if the intermediate potential exceeds the threshold voltage of the inverter 124D while affected by process variations and noise. In contrast, in the decision circuit 120E illustrated in FIG. 13, with the improved symmetry of the XOR gate 122E, the inverted reset pulse RSTB, as an output of the XOR gate 122E, has a voltage level close to L (0 V), when the latch circuit 110 in the previous stage is undefined. This can suppress the inverter 124E from erroneously negating the reset pulse RST. Now the symmetry of the gate when viewed from the inputs IN1 and IN2 may further be improved, by adding in parallel one more XOR gate 122E in which the input IN1 and the input IN2 are interchanged.

Figure 15:
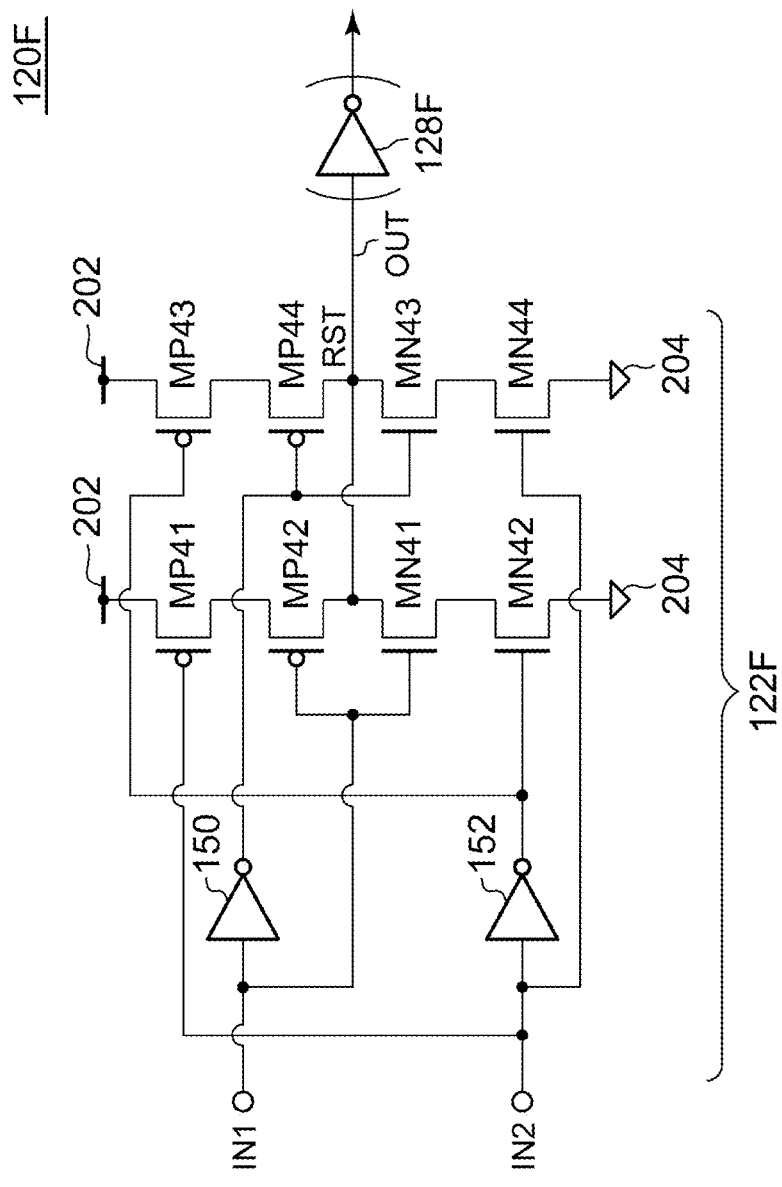
FIG. 15 is a circuit diagram illustrating an improved structure of the decision circuit.

FIG. 15 is a circuit diagram illustrating an improved structure (120F) of the decision circuit 120. The decision circuit 120F contains an XNOR gate 126F.

The XNOR gate 126F has the first input node IN1, the second input node IN2, the output node OUT, a first inverter 150, a second inverter 152, P-channel transistors MP41 to MP44, and N-channel transistors MN41 to MN44.

The first P-channel transistor MP41 and the second P-channel transistor MP42 are sequentially connected in series between the power supply line 202 and the output node OUT. The first N-channel transistor MN41 and the second N-channel transistor MN42 are sequentially connected in series between the output node OUT and the ground line 204.

The third P-channel transistor MP43 and the fourth P-channel transistor MP44 are sequentially connected in series between the power supply line 202 and the output node OUT. The third N-channel transistor MN43 and the fourth N-channel transistor MN44 are sequentially connected in series between the output node OUT and the ground line 204.

An input of the first inverter 150 is connected to the first input node IN1, and an output of the first inverter 150 is connected to the gate of the fourth P-channel transistor MP44 and the gate of the third N-channel transistor MN43. An input of the second inverter 152 is connected to the second input node IN2, and an output of the second inverter 152 is connected to the gate of the third P-channel transistor MP43 and the gate of the second N-channel transistor MN42. The gate of the second P-channel transistor MP42 and the gate of the first N-channel transistor MN41 are connected to the first input node IN1. The gate of the first P-channel transistor MP41 and the gate of the fourth N-channel transistor MN44 are connected to the second input node IN2.

The decision circuit 120F, having the symmetry of the XNOR gate 126F improved with respect to the two inputs IN1 and IN2, can yield the same effect as in the decision circuit 120E illustrated in FIG. 13. Now the symmetry of the gate may further be improved by adding in parallel one more XNOR gate 126F in which the input IN1 and the input IN2 are interchanged, similarly to the XOR gate 122E illustrated in FIG. 13. Note the decision circuit 120F may further contain a buffer 128F provided as an amplification stage in the subsequent stage of the XNOR gate 126F.

The foregoing description has dealt with the structures in which the decision circuit 120 (collective term for 120A, etc.) is constituted by a logic circuit (logic gates such as XOR gate, XNOR gate, etc.), and the reset pulse RST is negated when the logic levels of the two outputs Q and QB of the latch circuit 110 (collective term for 110A, etc.) do not match (that is, one is H and the other is L), assuming that the latch circuit 110 has transitioned to the stable state.

In the following Examples, different schemes of decision by the decision circuit 120 will be described.

More specifically, on the basis of the threshold $V_{TH}$ of the first inversion circuit 112 and the second inversion circuit 114, an upper threshold $V_{THH}$ higher than the threshold $V_{TH}$, and a lower threshold $V_{THL}$ lower than the threshold $V_{TH}$ will be determined. The decision circuit 120 keeps assertion of the reset pulse RST, when the voltage levels of the two outputs Q and QB fall within a decision voltage range defined between the two thresholds $V_{THH}$ and $V_{THL}$ (referred to as undefined voltage range), assuming that the latch circuit 110 is undefined, and negates the reset pulse RST, when the voltage levels of the two outputs Q and QB deviate from the undefined voltage range, assuming that the latch circuit 110 has transitioned to the stable state.

Example 4

Figure 16:
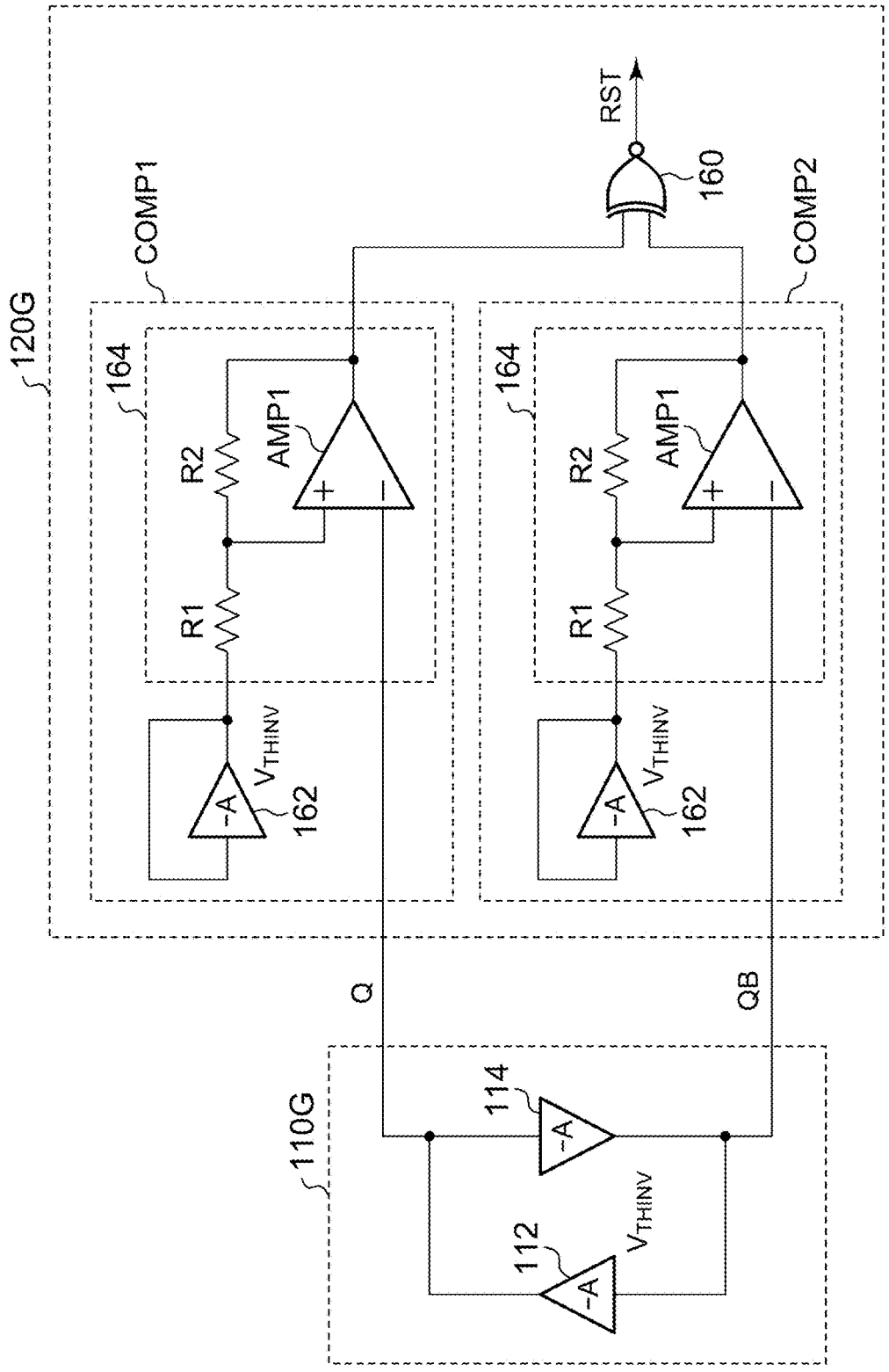
FIG. 16 is a circuit diagram of a power-on reset circuit of Example 4.

FIG. 16 is a circuit diagram of a power-on reset circuit 100G of Example 4. A latch circuit 110G has the first inversion circuit 112 and the second inversion circuit 114.

A decision circuit 120G contains two hysteresis comparators COMP1 and COMP2, and a logic gate 160. The first hysteresis comparator COMP1 determines whether the first signal Q falls in the undefined voltage range, and the second hysteresis comparator COMP2 determines whether the second signal QB falls in the undefined voltage range.

In this example, the hysteresis comparators COMP1 and COMP2 have the same structure, each containing a voltage source 162 and an inversion hysteresis comparator 164. The voltage source 162 is a replica having the same structure as the inversion circuits 112 and 114 that constitute the latch circuit 110G, with the input node and the output node thereof connected. The voltage source 162 generates a reference voltage whose voltage level is same as the threshold voltage $V_{THINV}$ of the inversion circuits 112 and 114.

The inversion hysteresis comparator 164 contains resistors R1, R2, and an amplifier AMP1. The inversion hysteresis comparator 164 receives a voltage that corresponds to the threshold voltage $V_{THINV}$ of the first inversion circuit 112 and the second inversion circuit 114. The threshold voltages $V_{THH}$ and $V_{THL}$ of the inversion hysteresis comparator 164 are determined according to the ratio of the resistors R1 and R2, and the reference voltage $V_{THINV}$.

The logic gate 160 is an XNOR gate, receives outputs of the two hysteresis comparators COMP1 and COMP2, and generates the reset pulse RST.

Figure 17:
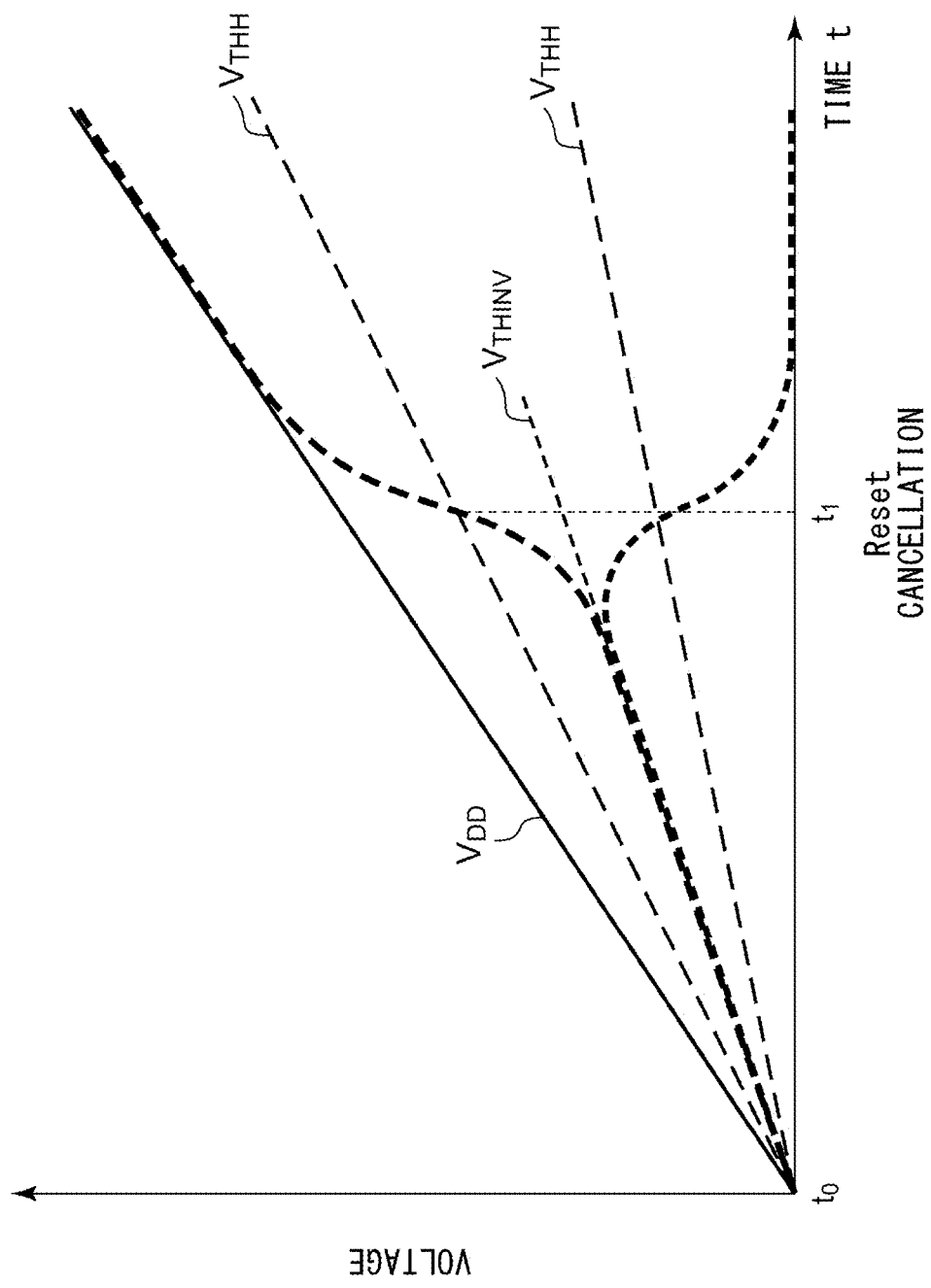
FIG. 17 is an operation waveform chart of the power-on reset circuit illustrated in FIG. 16.

FIG. 17 is an operation waveform chart of the power-on reset circuit 100G illustrated in FIG. 16. Upon powered on at time t0, the power supply voltage $V_{DD}$ increases with time, and the gain A of the first inversion circuit 112 and the second inversion circuit 114 increase, then the first signal Q and the second signal QB deviate from the intermediate potential $V_{THINV}$. Upon excess of one of the signals Q and QB above the upper limit value $V_{THH}$ of the undefined voltage range, and upon excess of the other below the lower limit value $V_{THL}$ of the undefined voltage range at time $t_1$, the resetting is canceled.

Example 5

Figure 18:
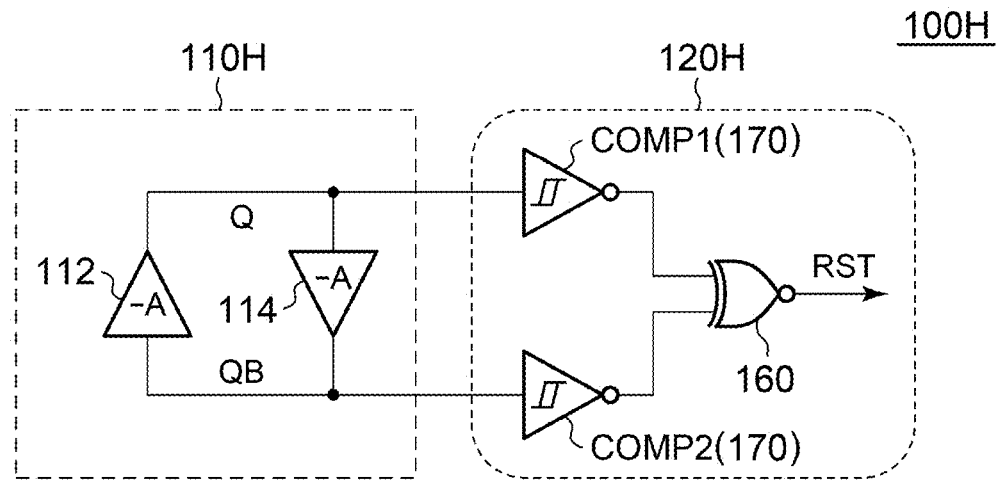
FIG. 18 is a circuit diagram of a power-on reset circuit of Example 5.
Figure 18:
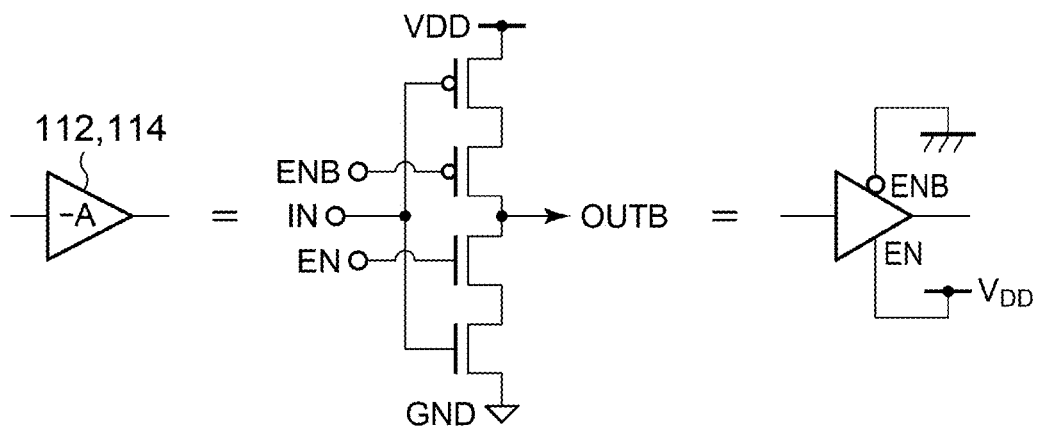
Figure 18:
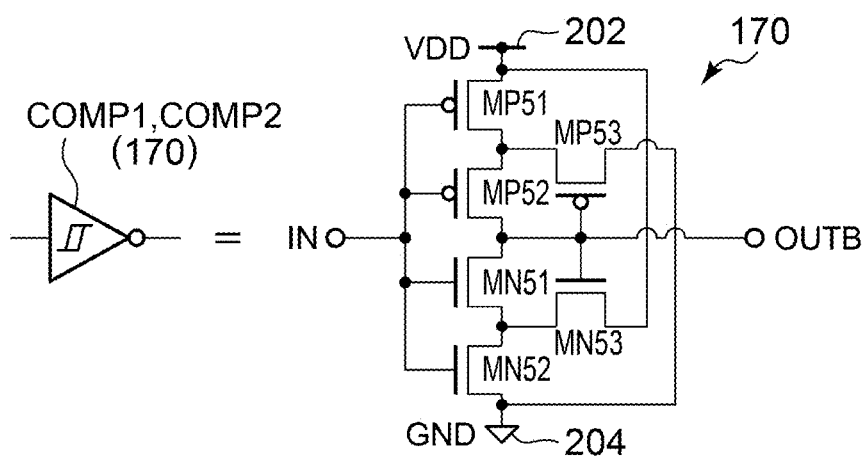

FIG. 18 is a circuit diagram of a power-on reset circuit 100H of Example 5. The power-on reset circuit 100H has a latch circuit 110H and a decision circuit 120H.

The decision circuit 120H is structured similarly to the decision circuit 120G illustrated in FIG. 16, and has two hysteresis comparators COMP1 and COMP2, and the logic gate 160. Each of the hysteresis comparators COMP1 and COMP2 illustrated in FIG. 18 may be replaced with a Schmitt trigger inverter 170.

An exemplary structure of the Schmitt trigger inverter 170 is illustrated in the lower tier of FIG. 18. The Schmitt trigger inverter contains P-channel transistors MP51 to MP53, and N-channel transistors MN51 to MN53. The P-channel transistors MP51 and MP52 are connected in series between the power supply line 202 and an output node OUTB, and the N-channel transistors MN51 and MN52 are connected in series between the output node OUTB and the ground line 204. The P-channel transistor MP53 is connected between the drain of the P-channel transistor MP51 and the ground line 204, with the gate of the P-channel transistor MP53 connected to the output node OUTB. The N-channel transistor MN53 is connected between the drain of the N-channel transistor MN52 and the power supply line 202, with the gate of the N-channel transistor MN53 connected to the output node OUTB. The threshold voltages $V_{THH}$ and $V_{THL}$ of the Schmitt trigger inverter may be designed according to the sizes (W/L) of the transistors MP51, MP52, MN51, and MN52.

Now, the number of levels and the size of the vertically stacked transistors in each of the inversion circuits 112 and 114 of the latch circuit 110 are preferably matched with the number of levels and the size of the transistors in the Schmitt trigger inverter. This makes it easy to design the threshold voltages $V_{THH}$ and $V_{THL}$ of the Schmitt trigger inverter so as to fall on both sides of the intermediate potential $V_{MID}$ of the inversion circuits 112 and 114. The middle tier of FIG. 18 illustrates a tri-state buffer (buffer with enable function) fixed to the enable state, as an example of the inversion circuits 112 and 114 constituted by four levels of transistors.

Example 6

FIG. 19 is a circuit diagram of a power-on reset circuit 100I of Example 6. The power-on reset circuit 100I has a latch circuit 110I and a decision circuit 120I.

Each of the inversion circuits 112 and 114 that constitutes the latch circuit 110I may be a NOR gate with a plurality of inputs connected in common. For example, the three-input NOR gate illustrated in FIG. 19 has three-level, high-side transistors (P-channel transistors) connected in series between the power supply line and the output node and has single-level three low-side transistors (N-channel transistors) connected in parallel between the output node and the ground line. The intermediate potential $V_{MID}$ in the undefined state therefore becomes lower than the midpoint voltage $V_{DD}/2$.

In this case, the undefined voltage range (threshold voltages $V_{THH}$ and $V_{THL}$ thereof), which serves as a reference of decision by the decision circuit 120I, is preferably shifted to the side opposite to the intermediate potential $V_{MID}$ of the latch circuit 110I, that is, the high potential side, across the midpoint voltage $V_{DD}/2$.

The decision circuit 120I has two hysteresis comparators COMP1 and COMP2, and the logic gate 160. Each of the hysteresis comparators COMP1 and COMP2 is constituted by a comparator 172 having a relatively high threshold voltage. As illustrated in the lower tier of FIG. 19, the comparator 172 may be a NAND (negative AND) gate 172a to which a plurality of inputs is connected in common. The three-input NAND gate 172a illustrated in FIG. 19 has single-level three high-side transistors (P-channel transistors) connected in parallel between the power supply line and the output node, and three-level, low-side transistors (N-channel transistors) connected in series between the output node and the ground line. Hence, the three-input NAND gate 172a will have the threshold voltage higher than the midpoint voltage $V_{DD}/2$ and is therefore suitably combined with the latch circuit 110I constituted by a NOR gate whose threshold voltage is lower than the midpoint voltage $V_{DD}/2$.

As illustrated in the lower tier of FIG. 19, the comparator 172 may be a Schmitt trigger inverter 172b. The Schmitt trigger inverter 172b is structured by omitting the transistors MP51 and MP53 from the Schmitt trigger inverter 172b illustrated in FIG. 18. The Schmitt trigger inverter 172b has a single-level high-side transistor (P-channel transistor) connected between the power supply line 202 and the output node OUTB, and two-level, low-side transistors (N-channel transistors) connected in series between the output node OUTB and the ground line 204. Hence, the Schmitt trigger inverter 172b will have the threshold voltage higher than the midpoint voltage $V_{DD}/2$ and is therefore suitably combined with the latch circuit 110I constituted by a NOR gate whose threshold voltage is lower than the midpoint voltage $V_{DD}/2$.

The decision circuit 120I illustrated in FIG. 19 has an AND gate, as the logic gate 160.

Example 7

Figure 20:
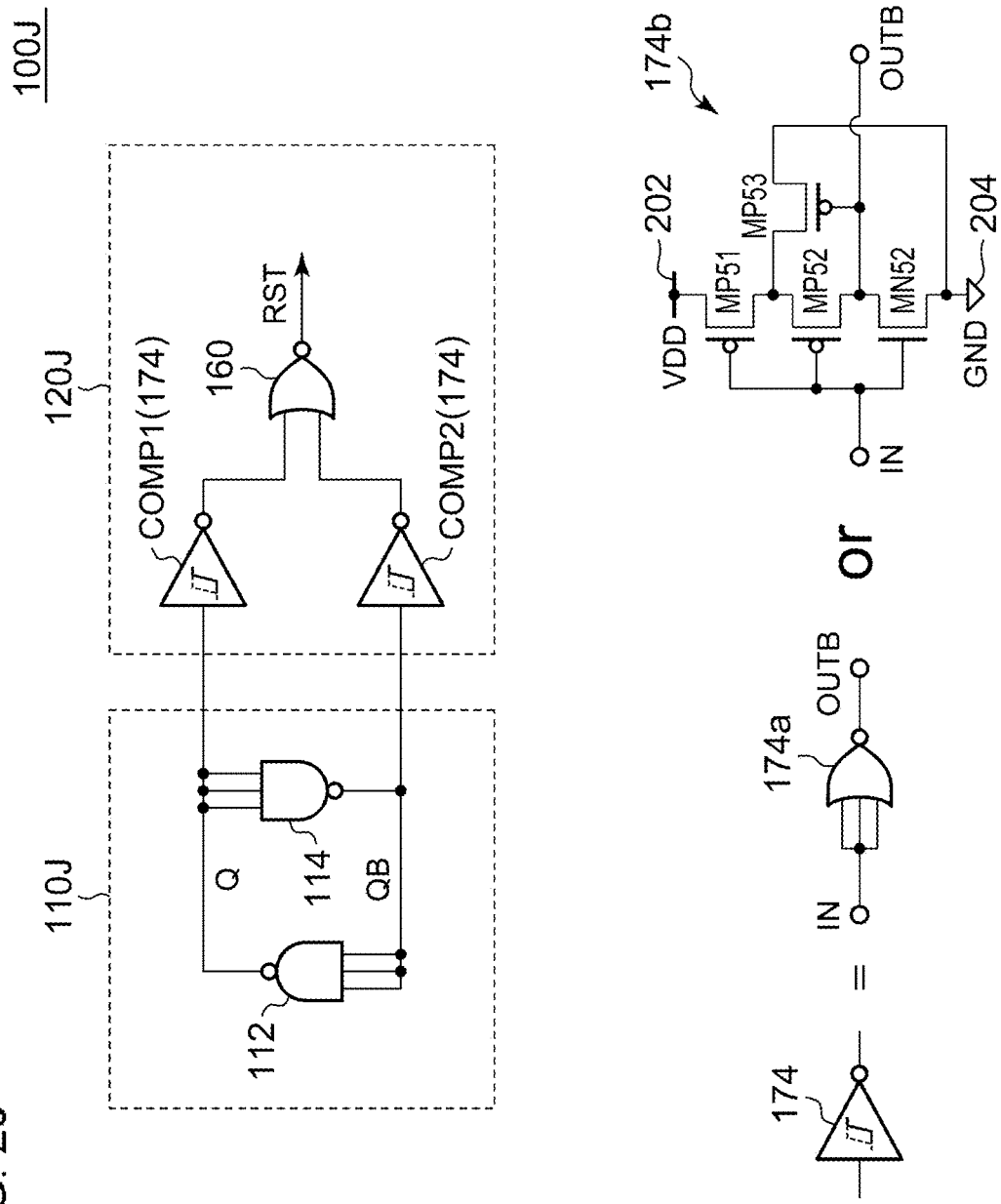
FIG. 20 is a circuit diagram of a power-on reset circuit of Example 7.

FIG. 20 is a circuit diagram of a power-on reset circuit 100J of Example 7. The power-on reset circuit 100J has a latch circuit 110J and a decision circuit 120J.

Each of the inversion circuits 112 and 114 that constitutes the latch circuit 110J may be a NAND gate with a plurality of (three, in this case) inputs connected in common. The threshold voltage (or the midpoint potential $V_{MID}$) of the NAND gate will be higher than the midpoint voltage $V_{DD}/2$, as described previously.

In this case, the undefined voltage range (threshold voltages $V_{THH}$ and $V_{THL}$ thereof), which serves as a reference of decision by the decision circuit 120J, is preferably shifted to the side opposite to the intermediate potential $V_{MID}$ of the latch circuit 110J, that is, the low potential side, across the midpoint voltage $V_{DD}/2$.

The decision circuit 120J has two hysteresis comparators COMP1 and COMP2, and the logic gate 160. Each of the hysteresis comparators COMP1 and COMP2 is constituted by a comparator 174 having a relatively low threshold voltage. As illustrated in the lower tier of FIG. 20, the comparator 174 may be a NOR gate 174a to which a plurality of inputs is connected in common. Hence, the NOR gate 174a will have the threshold voltage lower than the midpoint voltage $V_{DD}/2$ and is therefore suitably combined with the latch circuit 110J constituted by a NAND gate whose threshold voltage is higher than the midpoint voltage $V_{DD}/2$.

As illustrated in the lower tier of FIG. 20, the comparator 174 may be a Schmitt trigger inverter 174b. The Schmitt trigger inverter 174b is structured by omitting the transistors MN51 and MN53 from the Schmitt trigger inverter 170 illustrated in FIG. 18. The Schmitt trigger inverter 174b has two-level, high-side transistors (P-channel transistors) connected between the power supply line 202 and the output node OUTB, and a single-level, low-side transistor (N-channel transistor) connected between the output node OUTB and the ground line 204. Hence, the Schmitt trigger inverter 174b will have the threshold voltage lower than the midpoint voltage $V_{DD}/2$ and is therefore suitably combined with the latch circuit 110J constituted by a NAND gate whose threshold voltage is higher than the midpoint voltage $V_{DD}/2$.

Example 8

Figure 21:
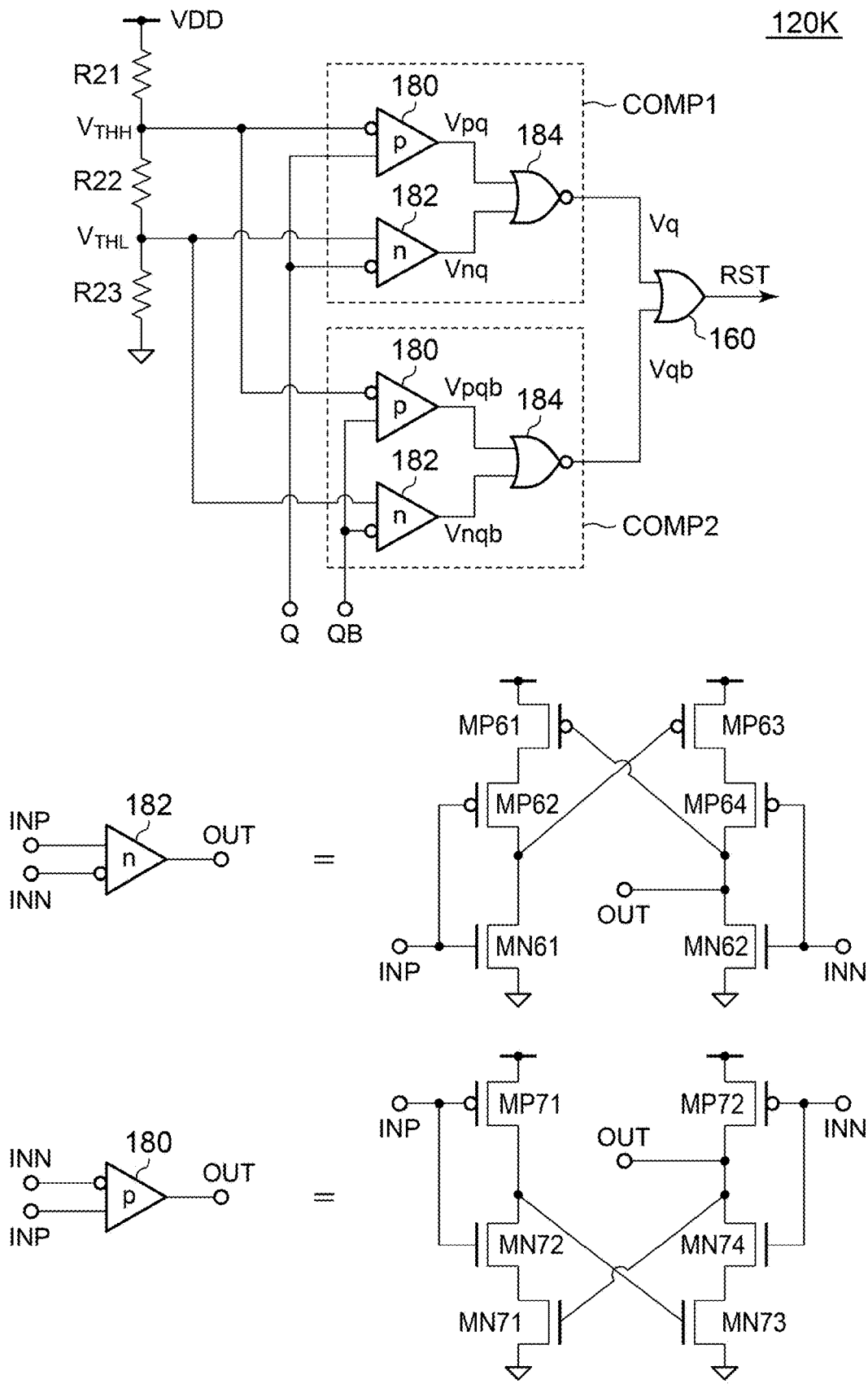
FIG. 21 is a circuit diagram of a decision circuit of Example 8.

FIG. 21 is a circuit diagram of a decision circuit 120K of Example 8. The decision circuit 120K has a voltage source 190, window comparators COMP1 and COMP2, and the logic gate 160.

The voltage source 190 includes a plurality of resistors R21 to R23 connected in series between the power supply line 202 and the ground line 204, with which the power supply voltage $V_{DD}$ is divided to generate threshold voltages $V_{THH}$ and $V_{THL}$.

The window comparator COMP1 compares the first signal Q with two threshold voltages $V_{THH}$, $V_{THL}$, determines whether the first signal Q falls in the undefined voltage range, and outputs a signal Vq. The window comparator COMP2 compares the second signal QB with two threshold voltages $V_{THH}$, $V_{THL}$, determines whether the second signal QB falls in the undefined voltage range, and outputs a signal Vqb.

Each of the window comparators COMP1 and COMP2 contains comparators 180 and 182, and a NOR gate 184. As illustrated in the lower tier of FIG. 21, the comparator 182 contains P-channel transistors MP61 to MP64, and N-channel transistors MN61 and MN62. The comparator 180 contains P-channel transistors MP71 and MP72, and N-channel transistors MN71 to MN74.

The logic gate 160 is an OR gate.

Upon stabilization of the latch circuit 110 in the previous stage of the decision circuit 120K, one of Vpq or Vnq, and the other one of Vpqb or Vngb become H. Therefore, both of Vq and Vqb become L, and also the reset pulse RST, which is the output of the logic gate 160, becomes L.

Lastly, an exemplary implementation of the power-on reset circuit 100 will be described. All the aforementioned power-on reset circuits are collectively referred to as the power-on reset circuit 100.

Figure 22:
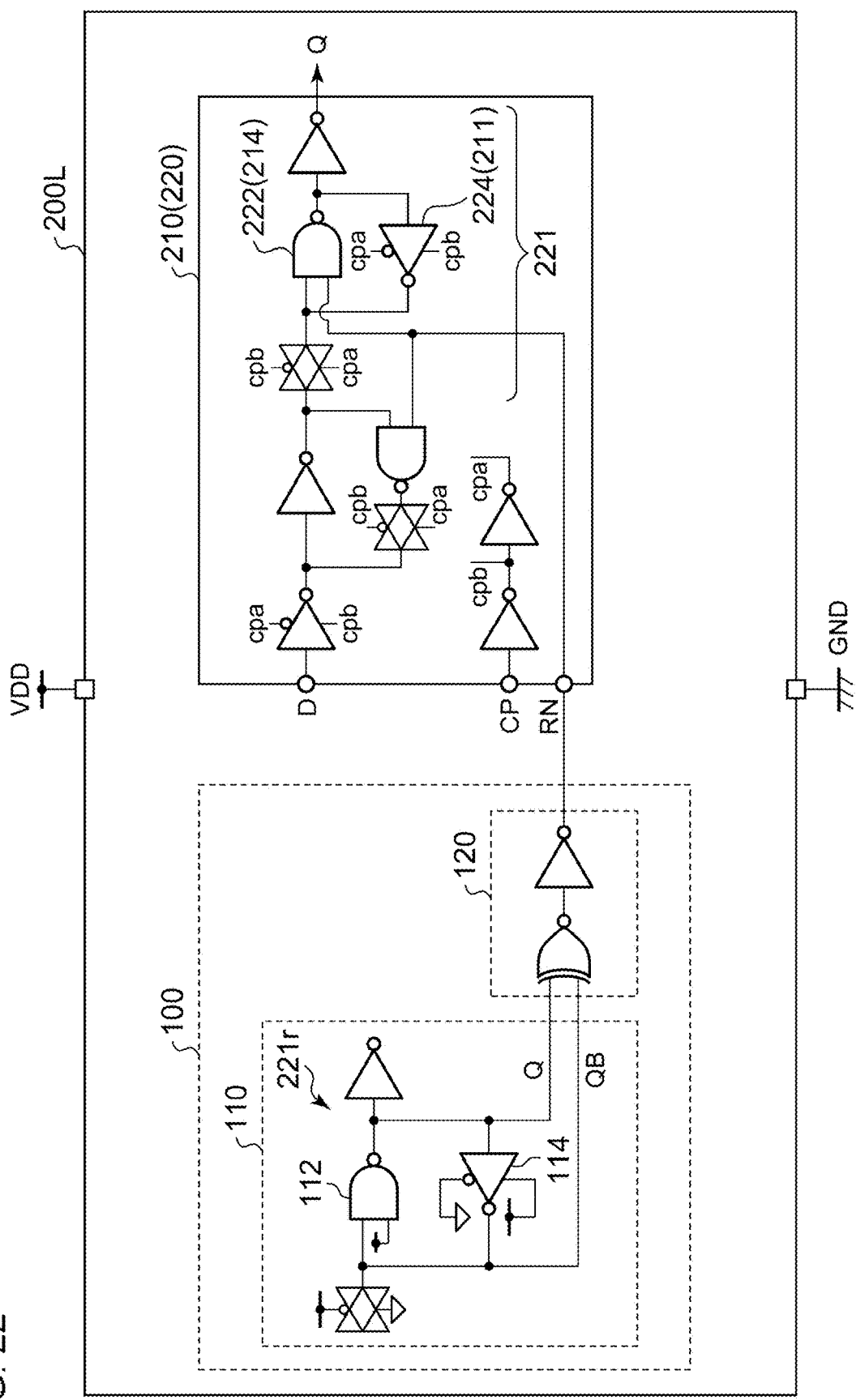
FIG. 22 is a block diagram of a semiconductor apparatus having the power-on reset circuit.

FIG. 22 is a block diagram of a semiconductor apparatus 200L having the power-on reset circuit 100. The circuit-to-be-initialized 210 is a resettable D flip-flop 220. The power-on reset circuit 100 supplies a reset pulse RST, to the reset terminal RN of the resettable D flip-flop.

The D flip-flop 220 has a NAND gate 222 and a tri-state buffer 224. The D flip-flop 220, the NAND gate 222, and the tri-state buffer 224 illustrated in FIG. 22 correspond to the sequential circuit 212, the first inversion circuit 214, and the second inversion circuit 216 illustrated in FIG. 5, respectively.

The reset pulse RST generated by the power-on reset circuit 100 is desirably negated upon, or immediately after, transition of a latch portion 221 of the D flip-flop 220 from the undefined state to the stable state. For this purpose, the latch circuit 110 of the power-on reset circuit 100 is preferably constituted by a replica 221r of the latch portion 221. Therefore, the first inversion circuit 112 of the latch circuit 110 is given by a NAND gate, and the second inversion circuit 114 is given by a tri-state buffer. This makes the power-on reset circuit 100 possible to correctly detect the transition of the circuit-to-be-initialized 210 from the undefined state to the stable state.

Figure 23:
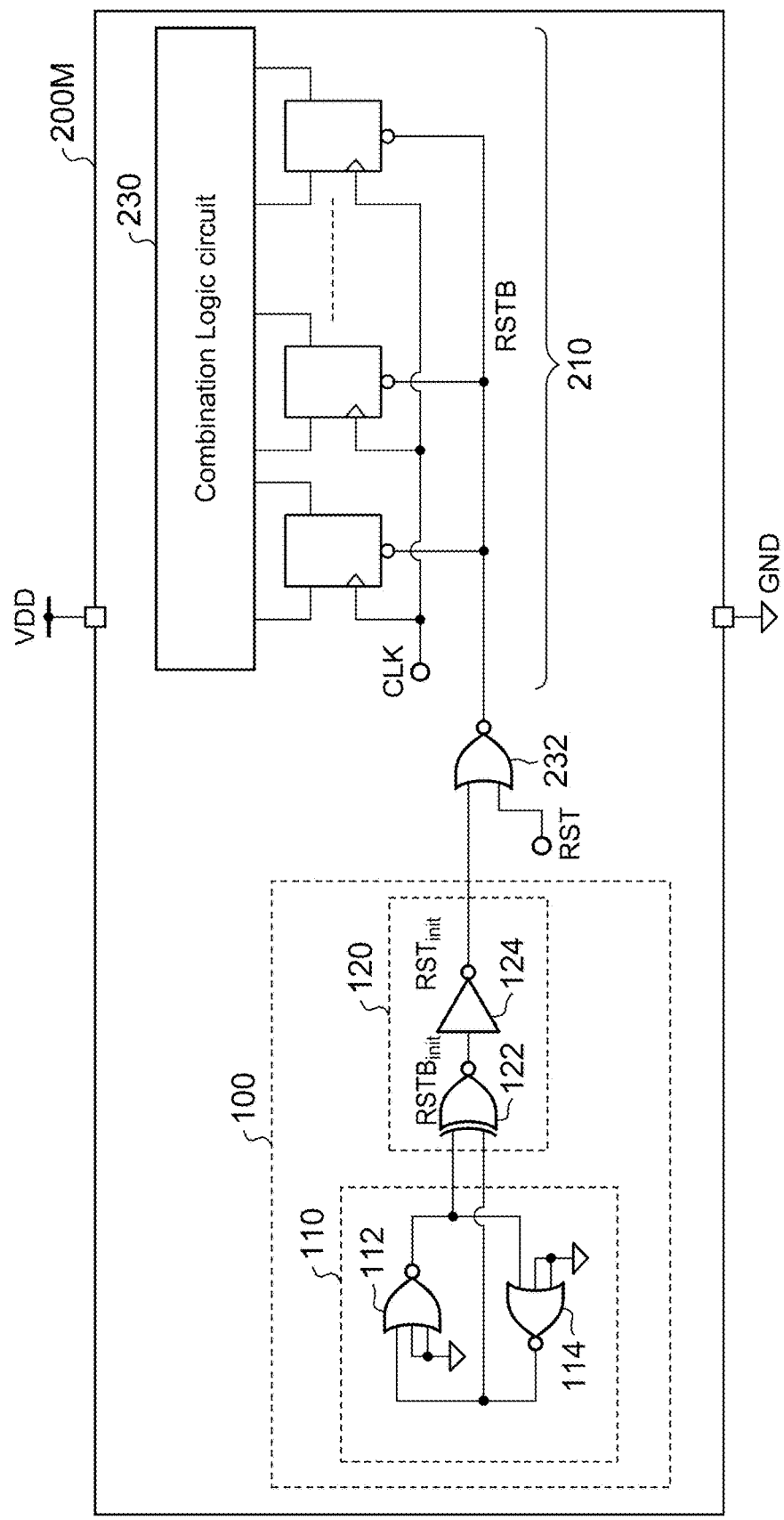
FIG. 23 is a block diagram of a semiconductor apparatus having the power-on reset circuit.

FIG. 23 is a block diagram of a semiconductor apparatus 200M having the power-on reset circuit 100. The circuit-to-be-initialized 210 has a plurality of D flip-flops DFF (memories) synchronized with a system clock CLK, and a combination logic circuit 230.

The power-on reset circuit 100 supplies the reset pulse RSTB, to a reset terminal of the D flip-flop DFF.

In this example, each of the first inversion circuit 112 and the second inversion circuit 114 of the latch circuit 110 is a NOR gate, given as a replica of an SR flip-flop contained in the D flip-flop DFF.

Furthermore, the semiconductor apparatus 200M can initialize the circuit-to-be-initialized 210, in response not only to the output $RST_{init}$ of the power-on reset circuit 100, but also to the internal reset signal RST, and this is why an NOR gate 232 is added.

It is to be understood by those skilled in the art that these embodiments are merely illustrative, that the individual constituents or combinations of various processes may be modified in various ways, and that also such modifications fall within the scope of the present disclosure.

APPENDIX

One aspect of the disclosure of the present specification can be understood as follows.

Item 1

A power-on reset circuit structured to supply a reset pulse to a sequential circuit to be initialized, the power-on reset circuit including:
  a latch circuit including a first inversion circuit and a second inversion circuit that invert and amplify a signal input thereto, wherein the first inversion circuit has an output node connected to an input node of the second inversion circuit, and the second inversion circuit has an output node connected to an input node of the first inversion circuit; and
  a decision circuit structured to receive a first signal from the output node of the first inversion circuit and a second signal from the output node of the second inversion circuit, and to generate the reset pulse on the basis of the first signal and the second signal.

Item 2

The power-on reset circuit according to item 1, wherein the latch circuit includes a replica of a latch portion that constitutes an output stage of the sequential circuit.

Item 3

The power-on reset circuit according to item 1 or 2, wherein the latch circuit has a gain equal to or smaller than a gain of a latch portion that constitutes an output stage of the sequential circuit.

Item 4

The power-on reset circuit according to any one of items 1 to 3, wherein each transistor included in the first inversion circuit and the second inversion circuit has a shape ratio W/L smaller than a shape ratio W/L of each transistor that constitutes a latch portion that constitutes the output stage of the sequential circuit.

Item 5

The power-on reset circuit according to any one of items 1 to 4, wherein at least either the first inversion circuit or the second inversion circuit is a complementary metal-oxide semiconductor inverter.

Item 6

The power-on reset circuit according to any one of items 1 to 5, wherein at least either the first inversion circuit or the second inversion circuit is a tri-state buffer.

Item 7

The power-on reset circuit according to any one of items 1 to 6, wherein at least either the first inversion circuit or the second inversion circuit is a NOR gate.

Item 8

The power-on reset circuit according to any one of items 1 to 7, wherein at least either the first inversion circuit or the second inversion circuit is a NAND gate.

Item 9

The power-on reset circuit according to any one of items 1 to 8, wherein in each of the first inversion circuit and the second inversion circuit, the number of levels of vertically-stacked transistors between a power supply line and a ground line is equal to or larger than the number of levels of vertically-stacked transistors in a latch portion that constitutes an output stage of the sequential circuit.

Item 10

The power-on reset circuit according to item 9, wherein in each of the first inversion circuit and the second inversion circuit, the number of levels of vertical stack on a higher potential side of the output node is different from the number of levels of vertical stack on a lower potential side of the output node.

Item 11

The power-on reset circuit according to any one of items 1 to 10, wherein the decision circuit negates the reset pulse when the first signal and the second signal do not match.

Item 12

The power-on reset circuit according to item 11, wherein the decision circuit includes an exclusive OR gate or an exclusive NOR gate.

Item 13

The power-on reset circuit according to item 11, wherein the decision circuit includes an exclusive OR gate, the exclusive OR gate having:
a first input node;
a second input node;
an output node;
a first inverter;
a second inverter;
a first P-channel transistor and a second P-channel transistor sequentially connected in series between a power supply line and the output node;
a first N-channel transistor and a second N-channel transistor sequentially connected in series between the output node and a ground line;
a third P-channel transistor and a fourth P-channel transistor sequentially connected in series between the power supply line and the output node; and
a third N-channel transistor and a fourth N-channel transistor sequentially connected in series between the output node and the ground line,
an input of the first inverter is connected to the first input node, an output of the first inverter is connected to a gate of the fourth P-channel transistor and a gate of the third N-channel transistor,
an input of the second inverter is connected to the second input node, and an output of the second inverter is connected to a gate of the first P-channel transistor and a gate of the fourth N-channel transistor,
a gate of the second P-channel transistor and a gate of the first N-channel transistor are connected to the first input node, and
a gate of the third P-channel transistor and a gate of the second N-channel transistor are connected to the second input node.

Item 14

The power-on reset circuit according to item 11, wherein the decision circuit includes an exclusive NOR gate, the exclusive NOR gate having:
a first input node;
a second input node;
an output node;
a first inverter;
a second inverter;
a first P-channel transistor and a second P-channel transistor sequentially connected in series between a power supply line and the output node;
a first N-channel transistor and a second N-channel transistor sequentially connected in series between the output node and a ground line;
a third P-channel transistor and a fourth P-channel transistor sequentially connected in series between the power supply line and the output node; and
a third N-channel transistor and a fourth N-channel transistor sequentially connected in series between the output node and the ground line,
an input of the first inverter is connected to the first input node, an output of the first inverter is connected to a gate of the fourth P-channel transistor and a gate of the third N-channel transistor,
an input of the second inverter is connected to the second input node, and an output of the second inverter is connected to a gate of the third P-channel transistor and a gate of the second N-channel transistor,
a gate of the second P-channel transistor and a gate of the first N-channel transistor are connected to the first input node, and
a gate of the first P-channel transistor and a gate of the fourth N-channel transistor are connected to the second input node.

Item 15

The power-on reset circuit according to any one of items 1 to 10, wherein the decision circuit asserts the reset pulse, when a voltage of the first signal and a voltage of the second signal fall within a decision voltage range defined so as to include thresholds of the first inversion circuit and the second inversion circuit.

Item 16

The power-on reset circuit according to item 15, wherein the decision circuit includes:
a first hysteresis comparator structured to compare the first signal with an upper limit voltage and a lower limit voltage of the voltage range;
a second hysteresis comparator structured to compare the second signal with the upper limit voltage and the lower limit voltage of the voltage range; and
a logic gate structured to receive an output of the first hysteresis comparator and an output of the second hysteresis comparator, and to generate the reset pulse.

Item 17

The power-on reset circuit according to item 16, wherein the first hysteresis comparator includes a first inversion hysteresis comparator structured to receive the first signal, and voltages corresponded to the thresholds of the first inversion circuit and the second inversion circuit; and
the second hysteresis comparator includes a second inversion hysteresis comparator structured to receive the second signal, and voltages corresponded to the thresholds of the first inversion circuit and the second inversion circuit.

Item 18

The power-on reset circuit according to item 16, wherein the first hysteresis comparator includes a first Schmitt trigger inverter structured to receive the first signal, and
the second hysteresis comparator includes a second Schmitt trigger inverter structured to receive the second signal.

Item 19

The power-on reset circuit according to item 15, wherein the thresholds of the first inversion circuit and the second inversion circuit fall on a lower potential side of a midpoint voltage between a power supply voltage and a ground voltage, and
a center of the voltage range falls on a higher potential side of the midpoint voltage.

Item 20

The power-on reset circuit according to item 15, wherein the thresholds of the first inversion circuit and the second inversion circuit fall on a higher potential side of a midpoint voltage between a power supply voltage and a ground voltage, and
a center of the voltage range falls on a lower potential side of the midpoint voltage.

Item 21

A semiconductor apparatus including:
a sequential circuit to be initialized; and
the power-on reset circuit according to any one of items 1 to 20.

What is claimed is:

1. A power-on reset circuit structured to supply a reset pulse to a sequential circuit to be initialized, the power-on reset circuit comprising:
   a latch circuit including a first inversion circuit and a second inversion circuit that invert and amplify a signal input thereto, wherein the first inversion circuit has an output node connected to an input node of the second inversion circuit, and the second inversion circuit has an output node connected to an input node of the first inversion circuit; and
   a decision circuit structured to receive a first signal from the output node of the first inversion circuit and a second signal from the output node of the second inversion circuit, and to generate the reset pulse according to the first signal and the second signal.

2. The power-on reset circuit according to claim 1, wherein the latch circuit includes a replica of a latch portion that constitutes an output stage of the sequential circuit.

3. The power-on reset circuit according to claim 1, wherein the latch circuit has a gain equal to or smaller than a gain of a latch portion that constitutes an output stage of the sequential circuit.

4. The power-on reset circuit according to claim 1, wherein each transistor included in the first inversion circuit and the second inversion circuit has a shape ratio W/L smaller than a shape ratio W/L of each transistor that constitutes a latch portion that constitutes an output stage of the sequential circuit.

5. The power-on reset circuit according to claim 1, wherein at least either the first inversion circuit or the second inversion circuit is a complementary metal-oxide semiconductor inverter.

6. The power-on reset circuit according to claim 1, wherein at least either the first inversion circuit or the second inversion circuit is a tri-state buffer.

7. The power-on reset circuit according to claim 1, wherein at least either the first inversion circuit or the second inversion circuit is a NOR gate.

8. The power-on reset circuit according to claim 1, wherein at least either the first inversion circuit or the second inversion circuit is a NAND gate.

9. The power-on reset circuit according to claim 1, wherein in each of the first inversion circuit and the second inversion circuit, the number of vertically-stacked transistors between a power supply line and a ground line is equal to or larger than the number of vertically-stacked transistors in a latch portion that constitutes an output stage of the sequential circuit.

10. The power-on reset circuit according to claim 9, wherein in the first inversion circuit, the number of vertically-stacked transistors between the power supply line and the output node of the first inversion circuit is different from the number of vertically-stacked transistors between the output node of the first inversion circuit and the ground line, and wherein in the second inversion circuit, the number of vertically-stacked transistors between the power supply line and the output node of the second inversion circuit is different from the number of vertically-stacked transistors between the output node of the second inversion circuit and the ground line.

11. The power-on reset circuit according to claim 1, wherein the decision circuit negates the reset pulse when the first signal and the second signal do not match.

12. The power-on reset circuit according to claim 11, wherein the decision circuit includes an exclusive OR gate or an exclusive NOR gate.

13. The power-on reset circuit according to claim 11, wherein the decision circuit includes an exclusive OR gate, the exclusive OR gate having:
a first input node;
a second input node;
an output node;
a first inverter;
a second inverter;
a first P-channel transistor and a second P-channel transistor sequentially connected in series between a power supply line and the output node of the exclusive OR gate;
a first N-channel transistor and a second N-channel transistor sequentially connected in series between the output node of the exclusive OR gate and a ground line;
a third P-channel transistor and a fourth P-channel transistor sequentially connected in series between the power supply line and the output node of the exclusive OR gate; and
a third N-channel transistor and a fourth N-channel transistor sequentially connected in series between the output node of the exclusive OR gate and the ground line,
an input of the first inverter is connected to the first input node, an output of the first inverter is connected to a gate of the fourth P-channel transistor and a gate of the third N-channel transistor,
an input of the second inverter is connected to the second input node, and an output of the second inverter is connected to a gate of the first P-channel transistor and a gate of the fourth N-channel transistor,
a gate of the second P-channel transistor and a gate of the first N-channel transistor are connected to the first input node, and
a gate of the third P-channel transistor and a gate of the second N-channel transistor are connected to the second input node.

14. The power-on reset circuit according to claim 11, wherein the decision circuit includes an exclusive NOR gate, the exclusive NOR gate having:
a first input node;
a second input node;
an output node;
a first inverter;
a second inverter;
a first P-channel transistor and a second P-channel transistor sequentially connected in series between a power supply line and the output node of the exclusive NOR gate;
a first N-channel transistor and a second N-channel transistor sequentially connected in series between the output node of the exclusive NOR gate and a ground line;
a third P-channel transistor and a fourth P-channel transistor sequentially connected in series between the power supply line and the output node of the exclusive NOR gate; and
a third N-channel transistor and a fourth N-channel transistor sequentially connected in series between the output node of the exclusive NOR gate and the ground line,
an input of the first inverter is connected to the first input node, an output of the first inverter is connected to a gate of the fourth P-channel transistor and a gate of the third N-channel transistor,
an input of the second inverter is connected to the second input node, and an output of the second inverter is connected to a gate of the third P-channel transistor and a gate of the second N-channel transistor,
a gate of the second P-channel transistor and a gate of the first N-channel transistor are connected to the first input node, and
a gate of the first P-channel transistor and a gate of the fourth N-channel transistor are connected to the second input node.

15. The power-on reset circuit according to claim 1, wherein the decision circuit asserts the reset pulse, when a voltage of the first signal and a voltage of the second signal fall within a decision voltage range defined so as to include thresholds of the first inversion circuit and the second inversion circuit.

16. The power-on reset circuit according to claim 15, wherein the decision circuit includes:
a first hysteresis comparator structured to compare the first signal with an upper limit voltage and a lower limit voltage of the voltage range;
a second hysteresis comparator structured to compare the second signal with the upper limit voltage and the lower limit voltage of the voltage range; and
a logic gate structured to receive an output of the first hysteresis comparator and an output of the second hysteresis comparator, and to generate the reset pulse.

17. The power-on reset circuit according to claim 16, wherein the first hysteresis comparator includes a first inversion hysteresis comparator structured to receive the first signal, and voltages corresponded to the thresholds of the first inversion circuit and the second inversion circuit; and
the second hysteresis comparator includes a second inversion hysteresis comparator structured to receive the second signal, and voltages corresponded to the thresholds of the first inversion circuit and the second inversion circuit.

18. The power-on reset circuit according to claim 16, wherein the first hysteresis comparator includes a first Schmitt trigger inverter structured to receive the first signal, and
the second hysteresis comparator includes a second Schmitt trigger inverter structured to receive the second signal.

19. The power-on reset circuit according to claim 15, wherein the thresholds of the first inversion circuit and the second inversion circuit fall on a lower potential side of a midpoint voltage between a power supply voltage and a ground voltage, and
a center of the voltage range falls on a higher potential side of the midpoint voltage.

20. The power-on reset circuit according to claim 15, wherein the thresholds of the first inversion circuit and the second inversion circuit fall on a higher potential side of a midpoint voltage between a power supply voltage and a ground voltage, and
a center of the voltage range falls on a lower potential side of the midpoint voltage.

* * * * *